(12) United States Patent
Takenaka

(10) Patent No.: US 6,181,622 B1
(45) Date of Patent: Jan. 30, 2001

(54) SEMICONDUCTOR MEMORY

(75) Inventor: Tetsuro Takenaka, Miyazaki (JP)

(73) Assignee: Oki Electric Industry Co., Ltd., Tokyo (JP)

( * ) Notice: Under 35 U.S.C. 154(b), the term of this patent shall be extended for 0 days.

(21) Appl. No.: 09/482,921

(22) Filed: Jan. 14, 2000

(30) Foreign Application Priority Data

Feb. 17, 1999 (JP) .................................................. 11-038467

(51) Int. Cl.$^7$ .................................................. G11C 13/00
(52) U.S. Cl. ................ 365/207; 365/230.03; 365/185.21
(58) Field of Search .............................. 365/185.21, 207, 365/230.03

(56) References Cited

U.S. PATENT DOCUMENTS 5,973,975 * 10/1999 Raad ..................................... 365/207
6,005,816 * 12/1999 Manning et al. ..................... 365/207
6,072,724 * 6/2000 Yamazaki ......................... 365/185.21

* cited by examiner

Primary Examiner—Terrell W. Fears
(74) Attorney, Agent, or Firm—Jones Volentine, L.L.C.

(57) ABSTRACT

A sense amplifier includes current mirror circuits, a NOR gate, inverters and a read data transition detection circuit. First and second read data respectively output from the inverters are input to the read data transition detection circuit. This read data transition detection circuit includes a NOR gate and outputs a logically low level transition detection signal to a data transition node when either of the first and second read data is at a logically high level. The output circuit corresponding to the sense amplifier receives the first read data in response to the transition detection signal. According to the constitution as described above, there can be provided a semiconductor memory in which the circuit scale is prevented from being unnecessarily enlarged and high speed access can be attained.

13 Claims, 28 Drawing Sheets

1:DRAM

SEMICONDUCTOR MEMORY

BACKGROUND OF THE INVENTION

1. Field of the Invention

The present invention relates to a semiconductor memory.

2. Description of the Related Art

Generally, in the data read operation of a dynamic random access memory (DRAM) as a semiconductor memory, a predetermined data as stored is first transmitted from a memory cell to a sense amplifier through a column switch, thereby being amplified there. This amplified data is further transmitted to an output circuit and is then read out to the outside of the DRAM.

In a prior art DRAM, when transmitting the read data from the sense amplifier to the output circuit, the sense amplifier and the output circuit have been controlled by an address transition detection signal (referred to as "signal ATD" hereinafter) and a data read control signal (referred to as "signal WE" hereinafter).

In general, in case of the DRAM which includes a complementary data line provided between the sense amplifier and the output circuit, the sense amplifier is controlled by the signal ATD and signal WE, and the input of the read data to the output circuit is executed in response to the level transition of the complementary data line.

Recently, however, the ATD signal speed has been made higher in association with the access speed to the DRAM. Thus, in such a DRAM that its output circuit is controlled by the ATD signal in order to stabilize the input of the read data to the output circuit, it is needed to provide a delay circuit for delaying the ATD signal, in order to provide a predetermined margin for the input timing of the read data.

On one hand, in such a DRAM that the input of the read data to the output circuit is carried out in response to the level transition of the complementary data line, it is not necessary to provide any delay circuit for delaying the ATD signal. In this case, however, it is absolutely required to provide the complementary data line. Contrary to this, in case of a so-called single data line DRAM which is provided with no complementary data line for the purpose of reducing the chip area, such a delay circuit as mentioned above has to be provided inevitably.

Generally, in the DRAM, a plurality of sense amplifiers and output circuits are controlled in the same timing. Therefore, if the number of sense amplifiers and output circuits is increased to comply with the increase in the memory capacity, the noise generation caused when reading the data comes out as another problem to be concerned with.

SUMMARY OF THE INVENTION

The present invention has been made in consideration of such problems as described above. Accordingly, the first object of the invention is to provide a semiconductor memory which can not only minimize the enlargement of the circuit scale but comply with the high speed access, and the second object of the invention is to provide a semiconductor memory which can prevent the noise generation which might be caused when reading the data.

In order to achieve the objects as described above, according to the invention, there is provided a semiconductor memory which includes n sense amplifiers (n: an integer of two and more) which amplify the data as stored and output the amplified data as the read data, and n output circuits (n: an integer of two and more) which output the output data based on the read data outputted from each of the sense amplifiers. Each of the sense amplifiers provided in this semiconductor memory includes a read data transition detection circuit which detects that there has been decided the level transition of each read data to be outputted to each of the output circuits, and outputs a read data transition detection signal. Each of the output circuits receives the read data outputted from each of the sense amplifiers in response to the read data transition detection signal outputted from the read data transition detection circuit which is provided in each of the corresponding sense amplifiers. According to the constitution of the semiconductor memory as described above, even if the semiconductor memory employs a single data line structure, there can be achieved the high speed input of the read data to each of the output circuits.

Each of the output circuits receives the read data outputted from each of the sense amplifiers based on all the read data transition detection signals which indicate that there have been decided all the level transitions of the read data outputted from each of the sense amplifiers. The semiconductor memory of the invention may be further provided with a first control circuit which detects that all the level transitions of the read data have been decided, and outputs all the read data transition detection signals. According to the semiconductor memory as constituted above, each output circuit can judge the level transitions of the read data outputted from n sense amplifiers at a time, based on all the read data transition detection signals. That is, it becomes possible not only to minimize the enlargement of the circuit scale but to input the read data to each of the output circuit at the high speed.

The first control circuit outputs a reset signal all the time until all the sense amplifiers output the read data transition detection signals, after any one of n sense amplifiers having decided the level transition of the read data at first, has outputted the read data transition detection signal. Each of the output circuits preferably sets its output node for putting out the output data in the high impedance state in response to the reset signal. According to the constitution as describe above, it becomes possible to reduce the power consumption in each output circuit and also to prevent the output noise from being generated.

The first output circuit of n output circuits sets its first output node for putting out the output data in the high impedance state in response to the reset signal, and receives the read data outputted from the corresponding sense amplifier in response to the all the read data transition detection signals; the second output circuit of n output circuits sets its second output node in the high impedance state based on that the first output node is set in the high impedance state, and receives the read data outputted from the corresponding sense amplifier based on that there has been decided the level transition of the output data outputted from the first output circuit; and the kth output circuit (k: an integer of three through n) of n output circuits sets its kth output node in the high impedance state based on that the k–1th output node of the k–1th output circuit is set in the high impedance state, and receives the read data outputted from the corresponding sense amplifier based on that there has been decided the level transition of the output data outputted from the k–1th output circuit. According to the constitution as described above, since each node in n output circuits is once set in the high impedance state, it becomes possible to reduce the power consumption in each output circuit and also to prevent the output noise from being generated. Moreover, since each output circuit comes to receive the read data outputted from each sense amplifier on the read data by read data basis, it becomes possible to further reduce the noise generation which might take place when receiving the read data and/or outputting the output data.

The n output circuits can be divided into m output circuit groups (m: an integer of two or more). The first control circuit is assigned to the first output circuit group while the ith control circuit (i: an integer of two through m) is assigned to the ith output circuit group. The first control circuit supplies all the read data transition detection signals and the reset signal to one or more than two of output circuits belonging to the first output circuit group. The ith control circuit sets the output nodes in one or more than two of output circuits in the high impedance state based on that the output node in at least one output circuit of one or more than two of output circuits belonging to the i–1th output circuit group is set in the high impedance state, and detects that there have been decided all the level transitions of the output data outputted from one or more than two of output circuits belonging to the i–1th output circuit group, and further allows one or more than two of output circuits belonging to the ith output circuit group to receive the read data outputted from the corresponding sense amplifier. With the constitution as described above, each of output circuit groups formed by dividing n output circuits comes to receive the read data on the basis of read data by read data. Thus, it becomes possible to reduce the noise generation which might take place when receiving the read data and/or outputting the output data based on that data input. Furthermore, since output circuit groups operate on the group by group basis, the output delay of the output data can be obviated or minimized.

The i–1th output circuit group preferably supplies the ith control circuit with signals which are the i–1th output node status signal indicating that at least one output node of respective nodes in one or more than two of output circuits belonging to the i–1th output circuit group is set in the high impedance state, and the i–1th output data transition detection signal indicating that there have been decided all the level transitions of the output data outputted from each output node in one or more than two of output circuits belonging to the i–1th output circuit group. With the constitution as described above, it becomes possible, without enlarging the circuit scale, to transmit the output node state and the level transition state of the output data in one or more than two of the output circuits belonging to the i–1th output circuit group to the ith output circuit group.

Each of output circuits preferably includes a read data holding portion for holding said read data supplied from each of the sense amplifiers. The read data holding portion can reset the read data as held thereby. According to the constitution as described above, the output node in each output circuit can be set in the high impedance state with ease, thus enabling the power consumption to be reduced as a result thereof.

Furthermore, the read data holding portion can employ the structure including a latch circuit consisting of two inverters, or an RS flip-flop circuit. According to the constitution as described above, the read data holding portion can be structured with a simple circuit. This is advantageous from the circuit layout standpoint.

The h+1th sense amplifier (h: an integer of one through n) of n sense amplifiers preferably starts the operation of data amplification based on that there has been decided the level transition of the read data outputted from the hth sense amplifier. According to the constitution as described above, each sense amplifier comes to start the operation of sense amplification and outputting the read data, so that it becomes possible to prevent the noise generation.

N sense amplifiers can be divided into j sense amplifier groups (j: an integer of two or more). The gth control circuit (g: an integer of two through j) is assigned to the gth sense amplifier group. The gth control circuit detects that the all the level transition of the output data outputted from one or more than two of sense amplifiers belonging to the g–1th sense amplifier group, and further allows one or more than two of sense amplifiers belonging to the gth sense amplifier group to start the operation of data amplification. According to the constitution as mentioned above, each of sense amplifier groups as a result of dividing n sense amplifiers comes to start the operation of amplification and outputting the read data on the step by step basis or amplifier by amplifier basis. Thus, it becomes possible to reduce the noise generation which might take place when starting the operation of amplification and/or outputting the read data. Furthermore, since sense amplifier groups operate on the group by group basis, the output delay of the read data can be avoided or minimized.

The g–1th sense amplifier group preferably supplies the gth control circuit with the g–1th read data transition detection signal indicating that there have been decided all the level transitions of the read data outputted from one or more than two of sense amplifiers belonging to said g–1th sense amplifier group. According to the constitution as described above, it becomes possible to transmit, without enlarging the circuit scale, the level transition state in the one or more than two of sense amplifiers belonging to the g–1th sense amplifier group to the gth control circuit.

BRIEF DESCRIPTION OF THE DRAWINGS

The above and other features of the invention and the concomitant advantages will be better understood and appreciated by persons skilled in the field to which the invention pertains in view of the following description given in conjunction with the accompanying drawings which illustrate preferred embodiments.

PREFERRED EMBODIMENTS OF THE INVENTION

Figure 1:
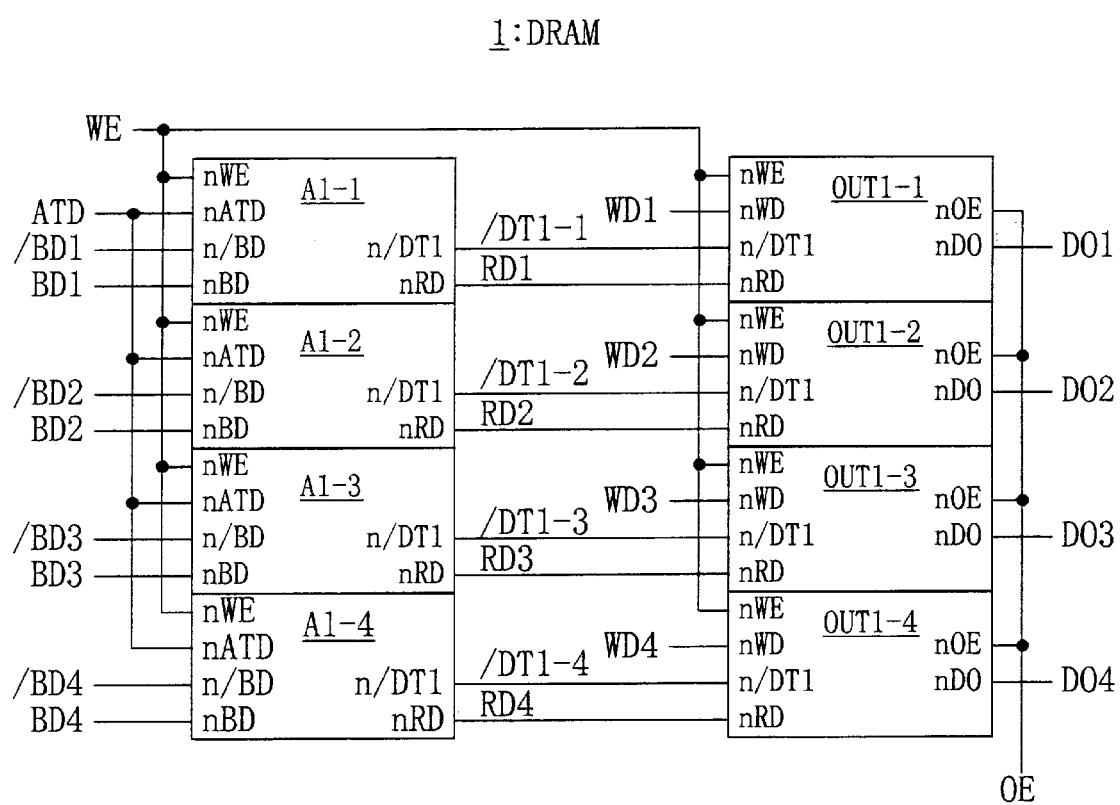
FIG. 1 is a block diagram showing the structure of a DRAM according to the first embodiment of the invention.

Preferred embodiments of a semiconductor memory according to the invention will now be described in detail in the following, with reference to accompanying drawings. In the following description and the accompanying drawings, in order to avoid the repetitive descriptions, an identical reference numeral or character is given to the constituents of the invention having almost identical functions.

A DRAM 1 as a semiconductor memory according to the first embodiment of the invention will now be described referring to FIGS. 1 through 3. In the following description of this embodiment, however, it is assumed that the DRAM 1 has a memory structure of n words x 4 bits.

The DRAM 1 includes 4 sense amplifiers A1-1, A1-2, A1-3 and A1-4, and 4 output circuits OUT1-1, OUT1-2, OUT1-3 and OUT1-4. Sense amplifiers A1-1~A1-4 are constituted to receive a signal WE and a signal ATD inputted through their nodes nWE and nATD, respectively. Sense amplifiers A1-1~A1-4 are constituted to receive complementary memory cell data BD1, /BD1, . . . and BD4, /BD4 inputted through their nodes nBD and n/BD, respectively.

Output circuits OUT1-1~OUT1-4 are constituted to receive the signal WE inputted through their nodes nWE, respectively. Output circuits OUT1-1~OUT1-4 are constituted to receive write data WD1, WD2, WD3 and WD4 inputted to their nodes nWD, respectively.

The sense amplifier A1-1 is constituted to supply a transition detection signal /DT1-1 and a read data RD1 to the output circuit OUT1-1. The sense amplifier A1-2 is constituted to supply a transition detection signal /DT1-2 and a read data RD2 to the output circuit OUT1-2. The sense amplifier A1-3 is constituted to supply a transition detection signal /DT1-3 and a read data RD3 to the output circuit OUT1-3. The sense amplifier A1-4 is constituted to supply a transition detection signal /DT1-4 and a read data RD4 to the output circuit OUT1-4.

Output circuits OUT1-1~OUT1-4 are constituted to receive the output control signal OE inputted through their nodes nOE, respectively, and they output the output data DO1~DO4 from their output nodes nDO, respectively, based on the output control signal OE.

Next, there will be described the structure of sense amplifiers A1-1~A1-4. Since these sense amplifiers have an almost identical structure, the sense amplifier A1-1 will be described as a representative of them with reference to FIG. 2.

The sense amplifier A1-1 includes dual end current mirror circuits 3 and 5, a NOR gate 7, inverters 9 and 11, and a read data transition detection circuit 13.

One input terminal of the NOR gate 7 is connected with the node nWE while the other input terminal of the same is connected with the node nATD. Logic signals based on the logic level of the signal WE and the signal ATD are supplied to the current mirror circuits 3 and 5. To the current mirror circuit 3, memory cell data BD1, /BD1 are inputted through nodes nBD, n/BD. The output signal from the current mirror circuit 3 is inputted to the inverter 9 through a node n10. In the same manner, memory cell data BD1, /BD1 are inputted to the current mirror circuit 5. The output signal from the current mirror circuit 5 is inputted to the inverter 11 through a node n11.

The read data /RD1 outputted from the inverter 9 and the read data RD1 outputted from the inverter 11 are inputted to the read data transition detection circuit 13. This read data transition detection circuit 13 includes a NOR gate 15 and outputs a transition detection signal /DT1-1 of a logical low level (referred to as "L-level" hereinafter) to the node n/DT1 when either the read data /RD1 or the read data RD1 is at a logical high level (referred to as "H-level" hereinafter).

In the next, there will be described the structure of the output circuit OUT1-1~OUT 1-4. Since these output circuits have an almost identical structure, the output circuit OUT1-1 will be described as a representative of them.

Figure 3:
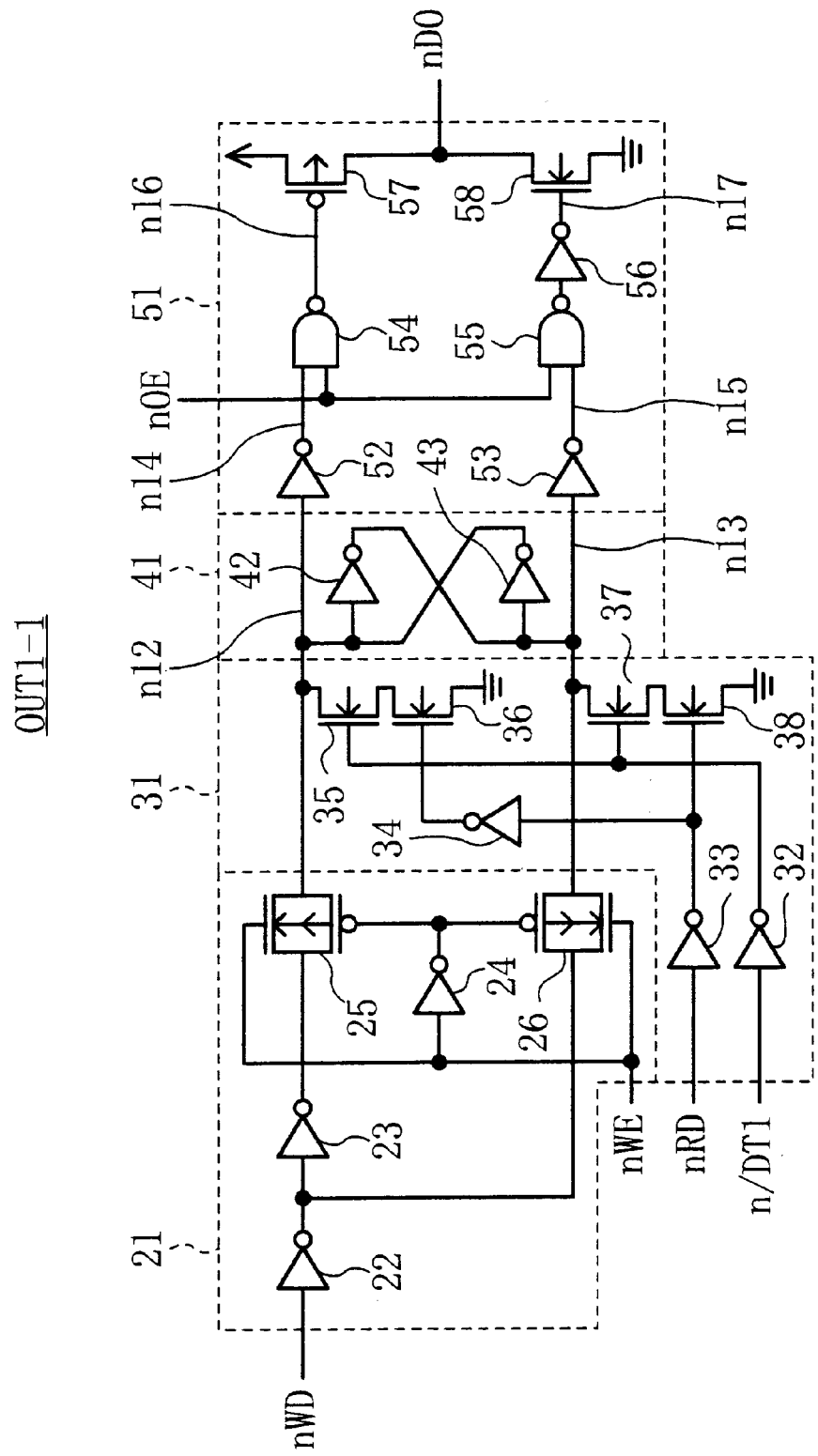
FIG. 3 is a circuit diagram showing the structure of a output circuit prepared in the DRAM shown in FIG. 1.

As shown in FIG. 3, the output circuit OUT1-1 is constituted to include a data switch portion 21, a read data input portion 31, a latch portion 41 and a data output portion 51.

The data switch portion 21 includes inverters 22, 23 and 24, and transfer gates 25 and 26. Inverters 22 and 23 generate a complementary signal from the write data WD1, and transfer gates 25 and 26 supply such complementary signal to both of nodes n12 and n13. The transfer gates 25 and 26 are constituted by an N-type transistor (referred to as N-transistor hereinafter) and a P-type transistor (referred to as P-transistor hereinafter), respectively, and are controlled by the signal WE and the logically inverted signal of the WE signal generated by the inverter 24, respectively.

The read data input portion 31 includes inverters 32, 33 and 34, and N-transistors 35, 36, 37 and 38.

The drain of the N-transistor 35 is connected with the node n12, and the drain of the N-transistor 36 is connected with the source of the N-transistor 35, and the source of the N-transistor 36 is grounded. Also, the drain of the N-transistor 37 is connected with the node n13, and the drain of the N-transistor 38 is connected with the source of the N-transistor 37, and the source of the N-transistor 38 is grounded.

The N-transistor 35 and the N-transistor 37 are constituted to respectively receive the transition detection signal /DT1-1 at their gates through the node n/DT1 and the inverter 32. The N-transistor 36 is constituted to receive the read data RD1 at its gate through the node nRD and also through inverters 33 and 34 connected in series. The N-transistor 38 is constituted to receive the read data RD1 at its gate through the node nRD and the inverter 33.

The latch portion 41 includes inverters 42 and 43.

The input terminal of the inverter 42 is connected with the node n12 while the output terminal of the same is connected with the node n13. On one hand, the input terminal of the inverter 43 is connected with the node n13 while the output terminal of the same is connected with the node n12.

The data output portion 51 includes inverters 52 and 53, a NAND gates 54 and 55, an inverter 56, a P-transistor 57 and N-transistor 58.

The input terminal of the inverter 52 is connected with the node n12 while the output terminal of the same is connected with one input terminal of the NAND gate 54 through the node n14. The input terminal of the inverter 53 is connected with the node n13 while the output terminal of the same is connected with one input terminal of the NAND gate 55 through the node n15.

The output terminal of the NAND gate 54 is connected with the gate of the P-transistor 57 through the node n16, and the output terminal of the NAND gate 55 is connected with the input terminal of the inverter 56. The output terminal of the inverter 56 is connected with the gate of N-transistor 58 through the node n17.

The source of the P-transistor 57 is connected with a power source while the source of the N-transistor 58 is grounded. The drains of P- and N-transistors 57 and 58 are respectively connected with the output node nDO for putting out the output data DO1.

The operation of the DRAM 1 as constituted above according to the first embodiment will now be explained in the following.

In the DRAM 1, when the read operation is started, for instance, memory cell data BD1 and /BD1 are read out from a predetermined memory cell (not shown), such memory cell data BD1 and /BD1 pass through a column switch (not shown) and are inputted to the sense amplifier A1-1. At this time, there is a very small potential difference between the complimentary memory cell data BD1 and the memory cell data /BD1.

When either the signal WE or the signal ATD is at the H-level, the sense amplifier A1-1 is set in the reset state. At this stage, if the signal WE and the signal ATD are set at the L-level, the sense amplification A1-1 starts amplifying the inputted memory cell data BD1 and /BD1, that is, starts its operation of sense amplification.

When the sense amplifier A1-1 starts its operation of sense amplification, one of nodes N10 and n11, both of which were at the H-level by means of the current mirror circuit 3 and the current mirror circuit 5 before the operation starts, is set at the L-level. In consequence of this level change of the node n10 or n11, the NOR gate 15 of the read data transition detection circuit 13 outputs the L-level transition detection signal /DT1-1.

In the data write operation, the transfer gates 25 and 26 included in the data switch portion 21 of the output circuit OUT1-1 are set in the ON state by the signal WE, and the write data WD1 is supplied to both of nodes n12 and n13. Such operation is carried out for reading out a predetermined data from the latch portion 41 of the output circuit OUT1-1 immediately after that data is written to a memory cell without again accessing to that memory cell. Thus, this operation can be performed for the purpose of achieving the high-speed data read and the low power consumption.

Contrary to this, in case of the data read operation, the transfer gates 25 and 26 are set in the OFF state. When the node n/DT1 of the output circuit OUT1-1 receives the L-level transition detection signal /DT1-1 inputted from the sense amplifier A1-1, both of N-transistors 35 and 37 belonging to the read data input portion 31 are turned on. Then, both of N-transistors 36 and 38 belonging to the read data input portion 31 are turned on/off in response to the level of the read data RD1 supplied to the node nRD from the sense amplifier A1-1, thereby each level of the nodes n12 and n13 being decided.

For instance, when the data "0" is read out from the memory cell, the sense amplifier A1-1 outputs the read data RD1 of the L-level from the node nRD. When the read data RD1 of the L-level is inputted to the output circuit OUT1-1, both of N-transistors 37 and 38 belonging to the read data input portion 31 are turned on, so that the nodes n13 is set at the L-level while the node n14 is set at the H-level by the latch portion 41.

Furthermore, since the output control signal OE is at the H-level, the node n16 is set at the H-level by the NAND gate 54 while the node n17 is set at the H-level by the NAND gate 55. The logical levels of both of nodes n12 and n13 are latched by the latch portion 41.

Still further, since both of the nodes n16 and n17 are set at the H-level, the P-transistor 57 is set in the OFF state while the N-transistor 58 is set in the ON state. As a result, the L-level output data DO1 is outputted from the output node nDO.

As described above, according to the DRAM 1 of the first embodiment, the input of the read data RD1~RD4 to the output circuits OUT1-1~OUT 1-4 is controlled by the transition detection signals /DT1-1~/DT1-4 outputted from the sense amplifiers A1-1~A1-4, respectively. Therefore, even if the DRAM 1 employs a single data line structure for the purpose of reducing the circuit scale, it is not necessary to ensure any timing margin for data read. That is, it is no longer needed to prepare any delay circuit for delaying the signal ATD, which has been provided so far, in order to ensure the timing margin for data read.

Figure 4:
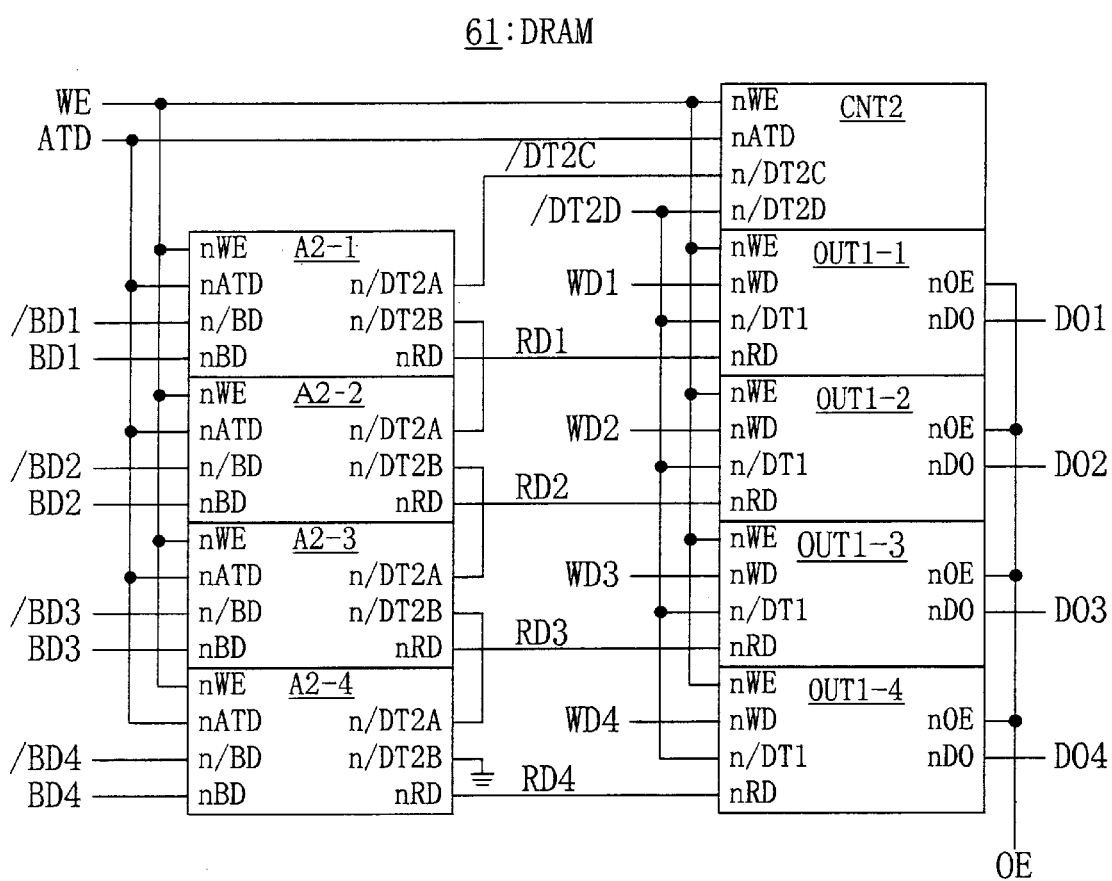
FIG. 4 is a block diagram showing the structure of a DRAM according to the second embodiment of the invention.
Figure 5:
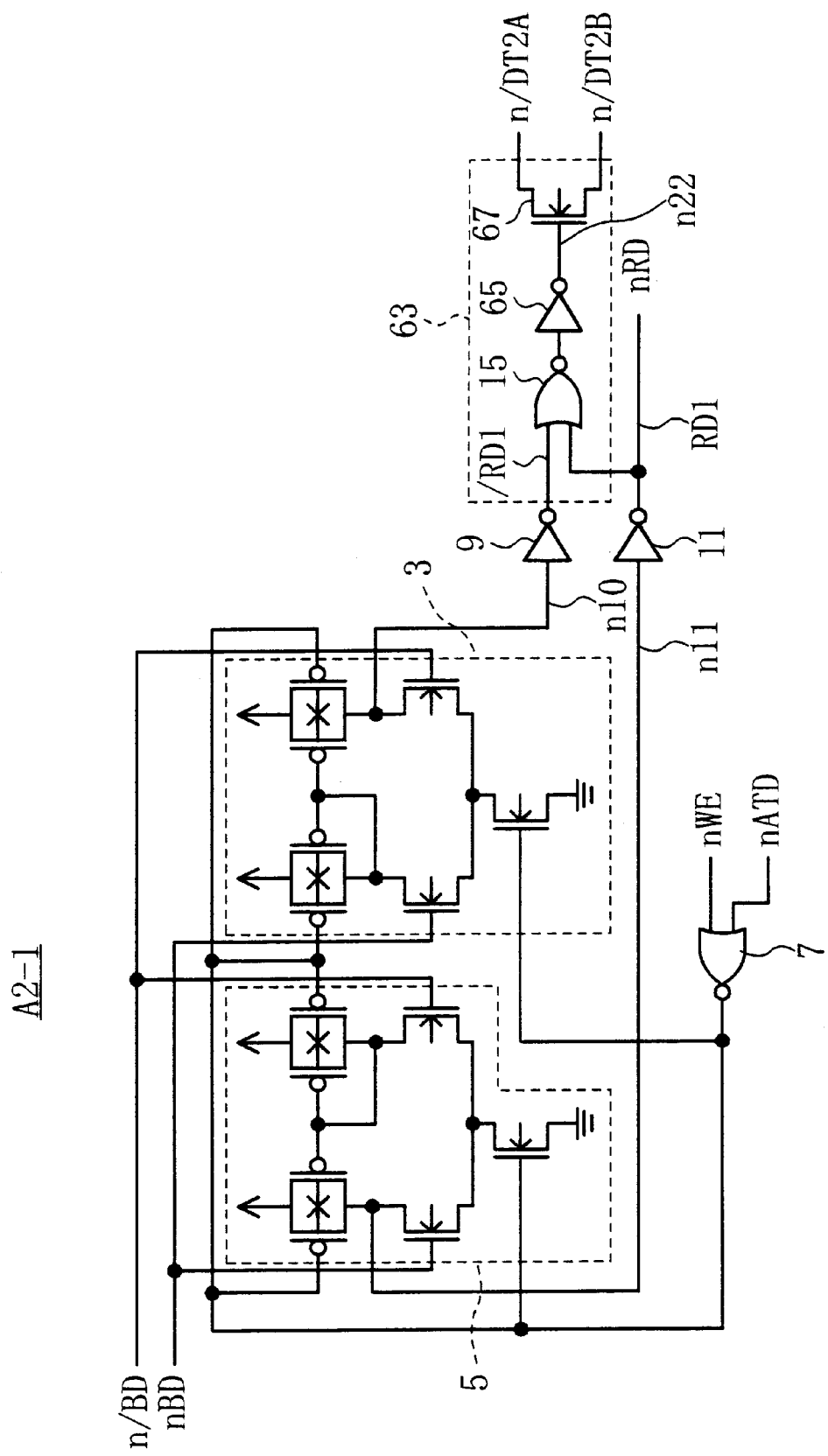
FIG. 5 is a circuit diagram showing the structure of a sense amplifier prepared in the DRAM shown in FIG. 4.
Figure 6:
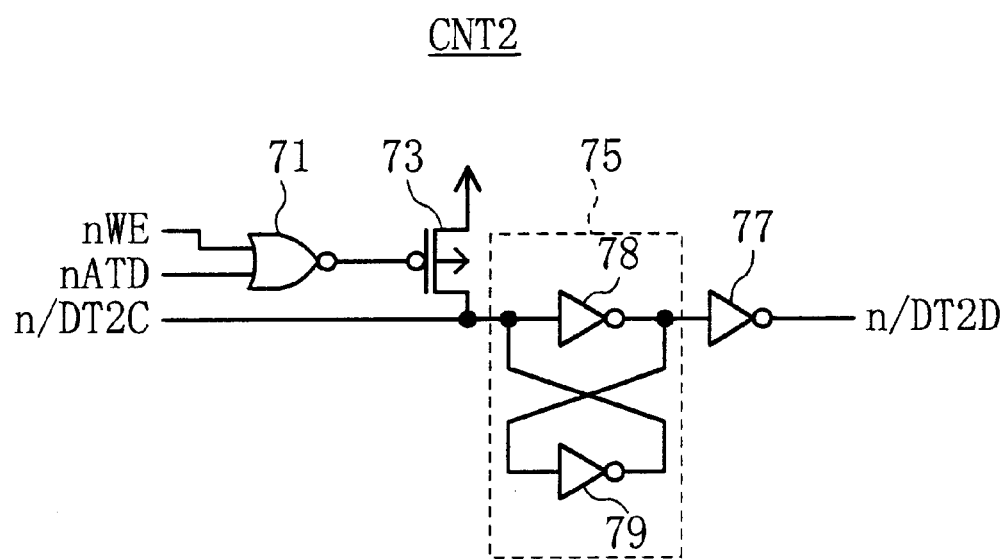
FIG. 6 is a circuit diagram showing the structure of a control circuit prepared in the DRAM shown in FIG. 4.

A DRAM 61 as a semiconductor memory, according to the second embodiment of the invention will be described with reference to FIGS. 4, 5 and 6 in the following. In the following description of this embodiment, however, it is assumed that the DRAM 61 has a memory structure of n words X 4 bits.

The DRAM 61 includes 4 sense amplifiers A2-1, A2-2, A2-3 and A2-4, 4 output circuits OUT1-1, OUT1-2, OUT1-3 and OUT1-4, and a control circuit CNT 2.

Sense amplifiers A2-1~A2-4 are constituted to receive the signal WE and the signal ATD inputted through their nodes nWE and nATD, respectively. Sense amplifiers A2-1~A2-4 are constituted to receive complementary memory cell data BD1, /BD1, . . . and BD4, /BD4 inputted through their nodes nBD and n/BD, respectively.

The node n/DT2A of the sense amplifier A2-1 is connected with the node n/DT2C of the control circuit CNT2 while the node n/DT2B of the sense amplifier A2-1 is connected with the node n/DT2A of the sense amplifier A2-2. The node n/DT2B of the sense amplifier A2-2 is connected with the node n/DT2A of the sense amplifier A2-3 while the node n/DT2B of the sense amplifier A2-3 is connected with the node n/DT2A of the sense amplifier A2-4. The node n/DT2B of the sense amplifier A2-4 is grounded.

The control circuit CNT2 is constituted to receive the signal WE inputted through its node nWE and also to receive the signal ATD inputted to its node nATD.

Output circuits OUT1-1~OUT1-4 are constituted to receive the signal WE inputted through their nodes nWE, respectively. Each node n/DT1 of output circuits OUT1-1~OUT1-4 is connected with the node n/DT2D of the control circuit CNT2. Output circuits OUT1-1~OUT1-4 are constituted to receive write data WD1, WD2, WD3 and WD4 inputted through their nodes nWD, respectively.

The sense amplifier A2-1 is constituted to supply a read data RD1 to the output circuit OUT1-1. The sense amplifier A2-2 is constituted to supply a read data RD2 to the output circuit OUT1-2. The sense amplifier A2-3 is constituted to supply a read data RD3 to the output circuit OUT1-3. The sense amplifier A2-4 is constituted to supply a read data RD4 to the output circuit OUT1-4.

Output circuits OUT1-1~OUT1-4 are constituted to receive the output control signal OE inputted through their nodes nOE, respectively, and they output the output data DO1~DO4 from their output nodes nDO, respectively, based on the output control signal OE.

In the next, there will be described the structure of sense amplifiers A2-1~A2-4. As these sense amplifiers have an almost identical structure, the sense amplifier A2-1 will be described as a representative of them with reference to FIG. 5.

Figure 2:
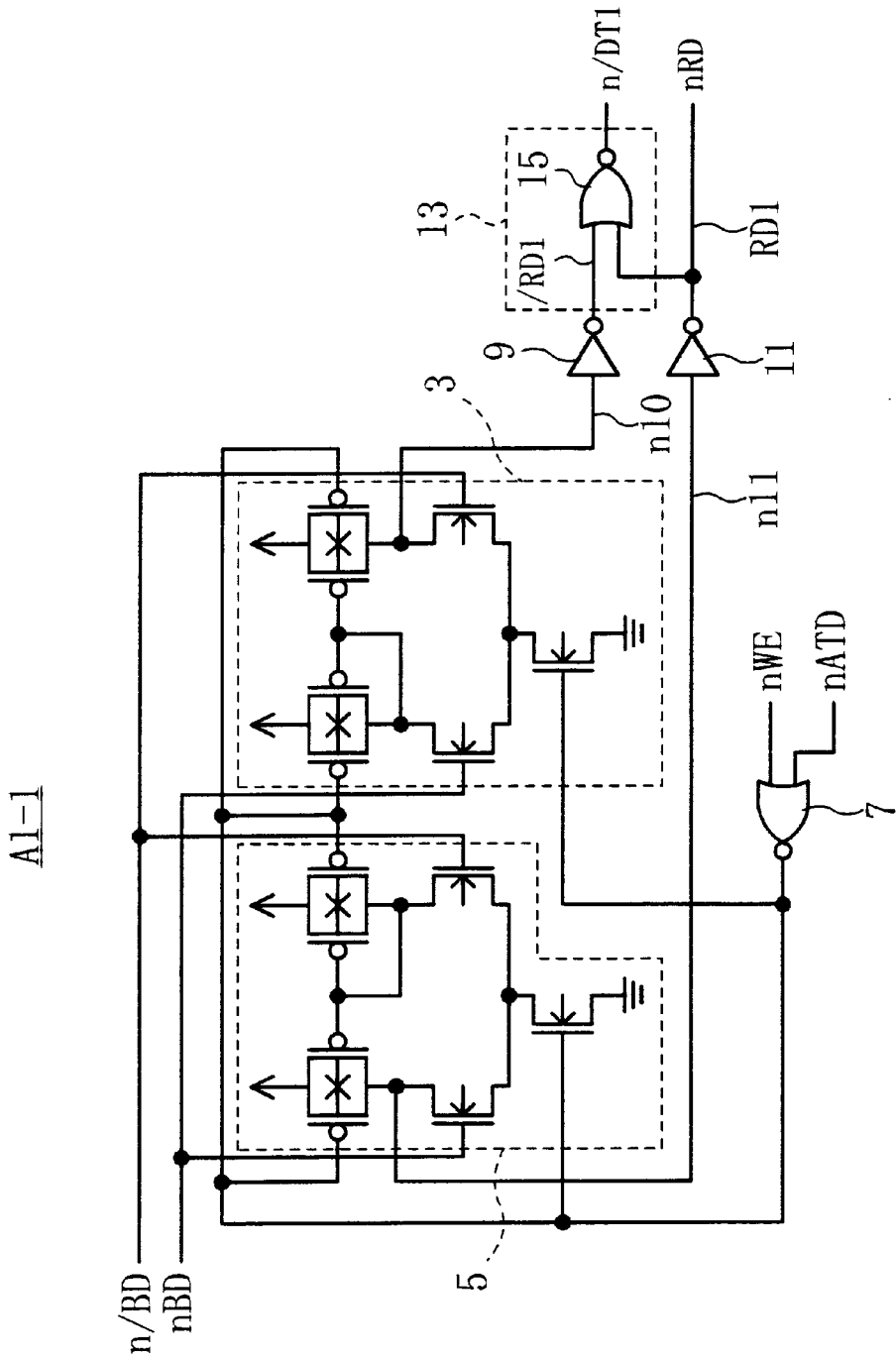
FIG. 2 is a circuit diagram showing the structure of a sense amplifier prepared in the DRAM shown in FIG. 1.

The sense amplifier A2-1 has such a structure that is obtained by substituting a read data transition detection circuit 63 for the read data transition detection circuit 13 as shown in FIG. 2. The read data /RD1 outputted from the inverter 9 and the read data RD1 outputted from the inverter 11 are inputted to the read data transition detection circuit 63.

The read data transition detection circuit 63 includes a NOR gate 15, an inverter 65 and an N-transistor 67. One input terminal of the NOR gate 15 is connected with the output terminal of the inverter 9 while the other input terminal of the same is connected with the output terminal of the inverter 11. The output terminal of the NOR gate is connected with the input terminal of an inverter 65, and the output terminal of the inverter 65 is connected with the gate of an N-transistor 67 through a node n22. The source of the N-transistor 67 is connected with the node n/DT2A while the drain of the same is connected with the node n/DT2B.

In the next, the structure of the control circuit CNT2 is described with reference to FIG. 6. The control circuit CNT2 includes a NOR gate 71, a P-transistor 73, a latch portion 75 and an inverter 77. The latch portion 75 further includes inverters 78 and 79. One input terminal of the NOR gate 71 is constituted to receive the signal WE inputted from the node nWE while the other input terminal of the same is constituted to receive the signal ATD inputted from the node nATD. The output terminal of the NOR gate 71 is connected with the gate of the P-transistor 73. The source of the P-transistor 73 is connected with a power source while the drain of the same is connected with the node n/DT2C. The input terminal of the inverter 78 and the output terminal of the inverter 79 are connected with the node n/DT2C. The output terminal of the inverter 78 and the input terminal of the inverter 79 are connected with the input terminal of the inverter 77, of which the output terminal is connected with the node n/DT2D.

In the next, the operation of the DRAM 61 as constituted above according to the second embodiment will be explained in the following. When the sense amplifier A2-1 starts its operation of sense amplification, one of nodes n10 and n11 both of which were at the H-level before the operation starts, is set at the L-level by means of the current mirror circuit 3 and the current mirror circuit 5. In consequence of this level change of the node n10 or n11, the NOR gate 15 outputs the L-level signal, thereby the N-transistor 67 being set in the ON state.

In the same manner, when all the N-transistors included in other sense amplifiers A2-2~A2-4 are set in the ON state, the node n/DT2C of the control circuit CNT2 is set at the L-level. Such L-level is latched by the latch portion 75 included in the control circuit CNT2 and the node n/DT2D is set at the L-level.

The node n/DT2D of the control circuit CNT2 is connected with the node n/DT1 of respective output circuits OUT1-1~OUT1-4, and these output circuits OUT1-1~OUT1-4 come to receive the read data RD1~RD4.

When the sense amplifier is in the reset state (signal WE or signal ATD=H-level), the P-transistor 73 is set in the ON state and the nodes n/DT2C and n/DT2D are reset to the H-level.

As described above, according to the DRAM 61 of the second embodiment, the transition detection signal /DT2C is set at the L-level when all the sense amplifier A2-1~A2-4 have outputted the read data RD1~RD4. With this, the read data RD1~RD4 are inputted to output circuits OUT1-1~OUT1-4, respectively. On the other hand, when any one of sense amplifiers A2-1~A2-4 is reset, the control circuit CNT2 outputs the H-level transition detection signal /DT2D from its node n/DT2D. With this, the read data RDIRD4 can not be inputted to output circuits OUT1-1~OUT1-4. In other words, the input operation of the read data RD1~RD4 to output circuits OUT1-1~OUT1-4 is controlled by the control signal /DT2D. Therefore, similar to the case of the DRAM 1 according to the first embodiment, despite that the DRAM 61 employs a single data line structure, it become possible to read the data without providing any delay circuit for delaying the signal ATD in order to ensure the timing margin.

Furthermore, in the DRAM 61 according to the second embodiment, the number of wirings between each of sense amplifiers A2-1~A2-4 and each of output circuits OUT1-1~OUT1-4 is reduced in comparison with the DRAM 1 according to the first embodiment. Therefore, the DRAM 61 is advantageous when employing the multi-bit structure (x 16-bit, x 32-bit) from the standpoint of reduction of the wiring area.

Figure 7:
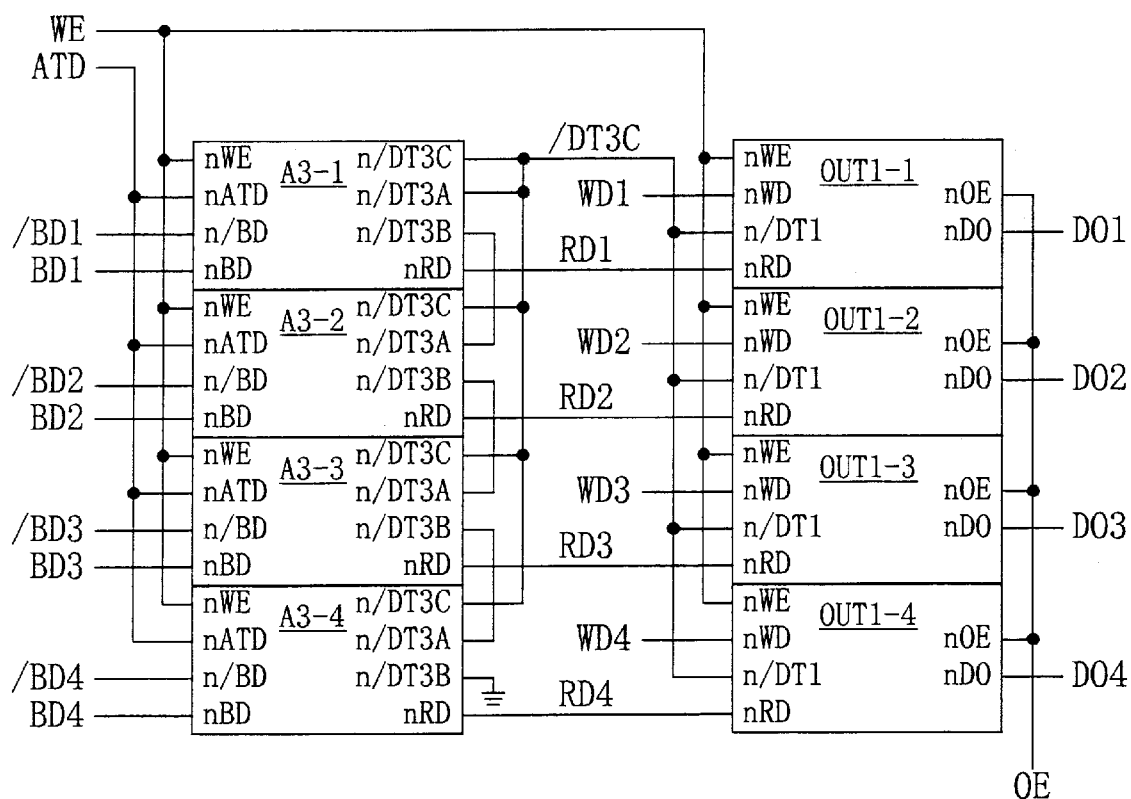
FIG. 7 is a block diagram showing the structure of a DRAM according to the third embodiment of the invention.
Figure 8:
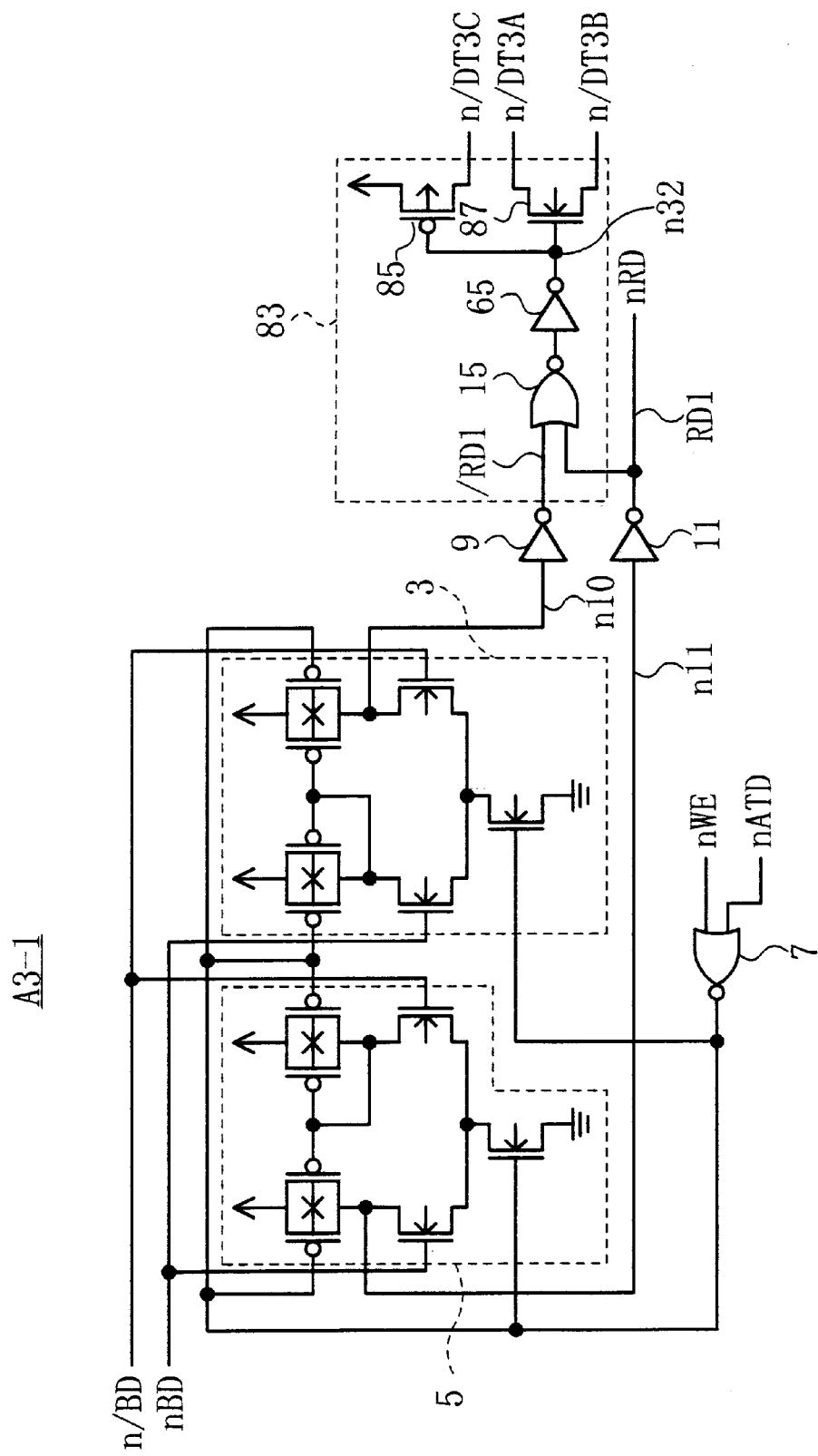
FIG. 8 is a circuit diagram showing the structure of a sense amplifier prepared in the DRAM shown in FIG. 7.
Figure 9:
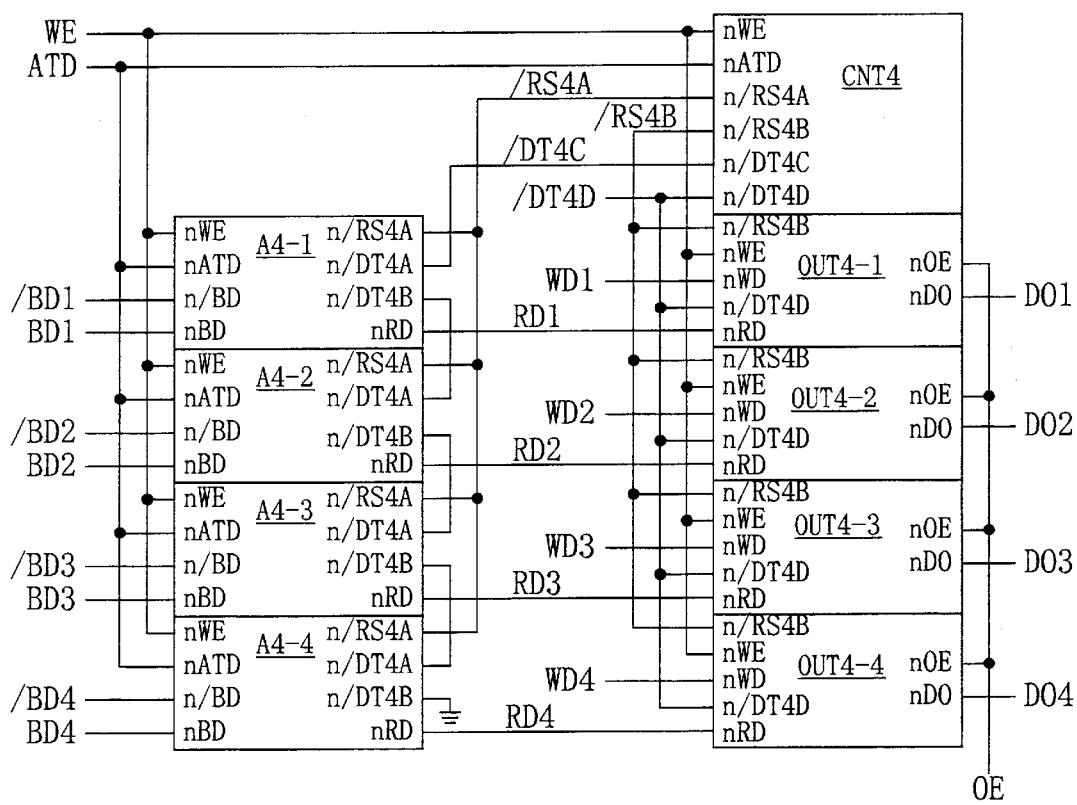
FIG. 9 is a block diagram showing the structure of a DRAM according to the fourth embodiment of the invention.
Figure 10:
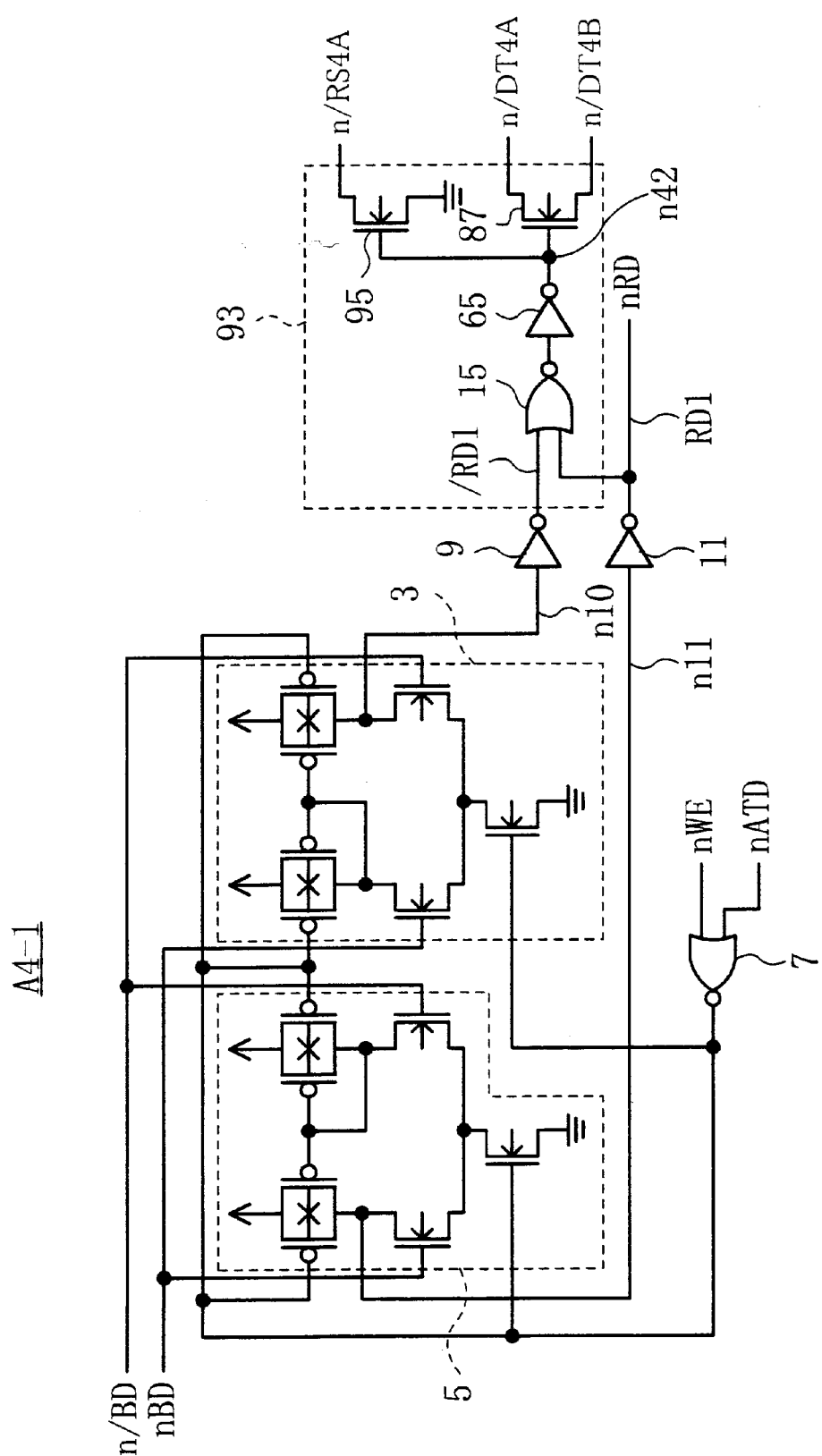
FIG. 10 is a circuit diagram showing the structure of a sense amplifier prepared in the DRAM shown in FIG. 9.
Figure 11:
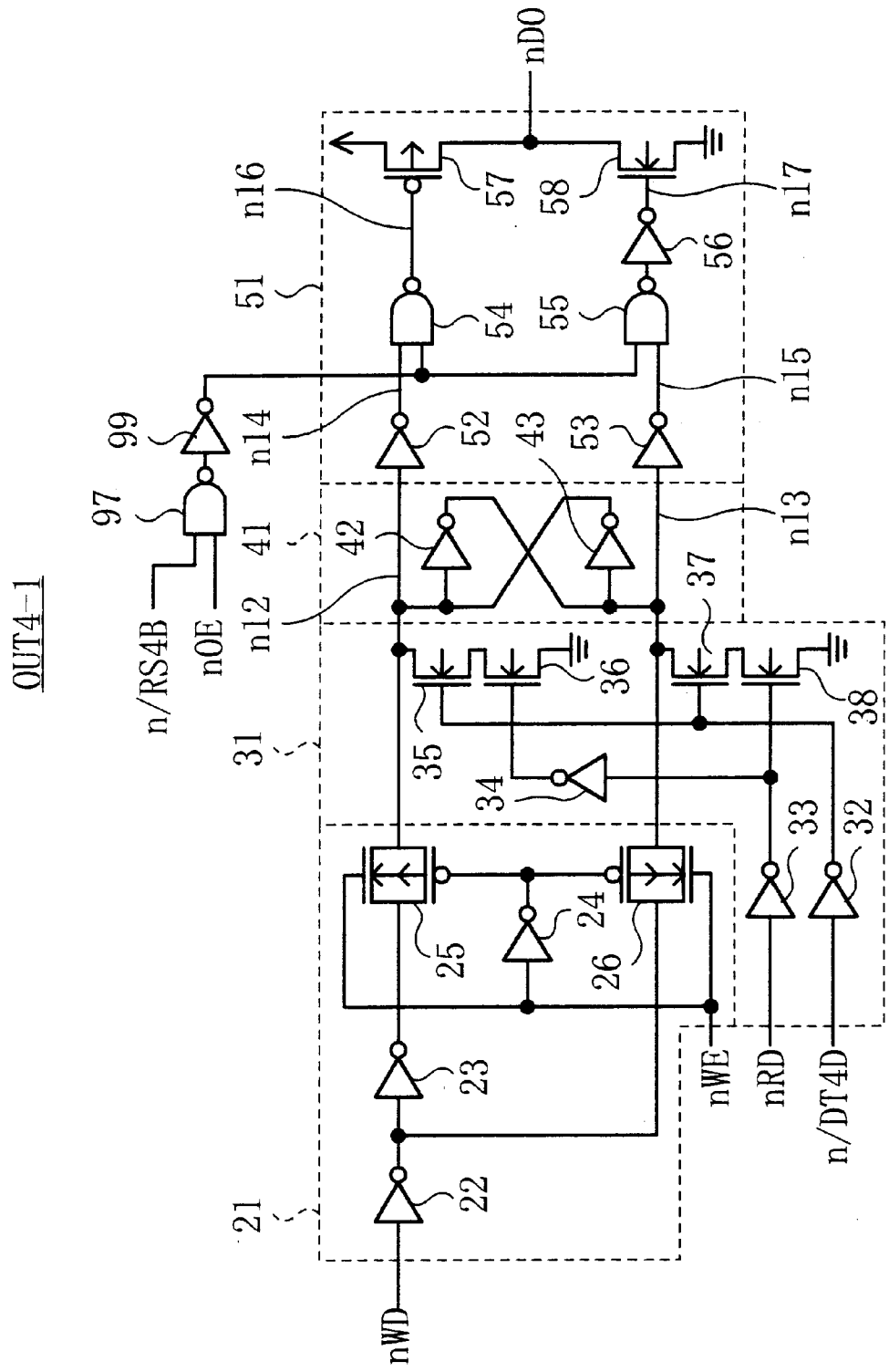
FIG. 11 a circuit diagram showing the structure of a output circuit prepared in the DRAM shown in FIG. 9.

In the next, a DRAM 81 as a semiconductor memory, according to the third embodiment of the invention will be described with reference to FIGS. 7 and 8 in the following. In the following description, however, it is assumed that the DRAM 81 has a memory structure of n words X 4 bits.

The DRAM 81 includes 4 sense amplifiers A3-1, A3-2, A3-3 and A3-4, and 4 output circuits OUT1-1, OUT1-2, OUT1-3 and OUT1-4.

Sense amplifiers A3-1~A3-4 are constituted to receive the signal WE and the signal ATD inputted through their nodes nWE and nATD, respectively. Sense amplifiers A3-1~A3-4 are constituted to receive complementary memory cell data BD1, /BD1, . . . and BD4, /BD4 inputted through their nodes nBD and n/BD, respectively.

The node n/DT3B of the sense amplifier A3-1 is connected with the node n/DT3A of the sense amplifier A3-2. The node n/DT3B of the sense amplifier A3-2 is connected with the node n/DT3A of the sense amplifier A3-3. The node n/DT3B of the sense amplifier A3-3 is connected with the node n/DT3A of the sense amplifier A3-4. The node n/DT3B of the sense amplifier A3-4 is grounded.

Output circuits OUT1-1~OUT1-4 are constituted to receive the signal WE inputted through their node nWE, respectively.

Each node n/DT3C of sense amplifiers A3-1~A3-4, each node n/DT1 of output circuits OUT1-1~OUT1-4 and the node n/DT3A of sense amplifier A3-1 are connected with each other by means of a common line. Output circuits OUT1-1~OUT1-4 are constituted to receive write data WD1, WD2, WD3 and WD4 inputted through their nodes nWD.

The sense amplifier A3-1 is constituted to supply a read data RD1 to the output circuit OUT1-1. The sense amplifier A3-2 is constituted to supply a read data RD2 to the output circuit OUT1-2. The sense amplifier A3-3 is constituted to supply a read data RD3 to the output circuit OUT1-3. The sense amplifier A3-4 is constituted to supply a read data RD4 to the output circuit OUT1-4.

Output circuits OUT1-1~OUT1-4 are constituted to receive the output control signal OE inputted through their nodes nOE, respectively, and they output the output data DO1~DO4 from output nodes nDO based on the output control signal OE.

In the next, there will be described the structure of sense amplifiers A3-1~A3-4. As these sense amplifiers A3-1~A3-4 have an almost identical structure, the sense amplifier A3-1 will be described as a representative of them with reference to FIG. 8.

The sense amplifier A3-1 has such a structure that is obtained by substituting a read data transition detection circuit 83 for the read data transition detection circuit 13 instead of the sense amplifier A1-1 as shown in FIG. 2.

The read data /RD1 outputted from the inverter 9 and the read data RD1 outputted from the inverter 11 are inputted to the read data transition detection circuit 83.

The read data transition detection circuit 83 includes a NOR gate 15, an inverter 65, a P-transistor 85 and an N-transistor 87. One input terminal of the NOR gate 15 is connected with the output terminal of the inverter 9 while the other input terminal of the same is connected with the output terminal of the inverter 11. The output terminal of the NOR gate is connected with the input terminal of an inverter 65, and the output terminal of the inverter 65 is connected with respective gates of the P-transistor 85 and the N-transistor 87 through the node n32. The source of the P-transistor 85 is connected with the power source while the drain of the same is connected with the node n/DT3C. The source of the N-transistor 87 is connected with the node n/DT3A while the drain of the same is connected with the node n/DT3B.

In the next, the operation of the DRAM 81 as constituted above according to the third embodiment will now be explained in the following.

When the sense amplifier A3-1 starts its operation of sense amplification, one of nodes n10 and n11 both of which were at the H-level before the operation starts, is set at the L-level by means of the current mirror circuit 3 and the current mirror circuit 5. In consequence of this level change of the node n10 or n11, the NOR gate 15 outputs the L-level signal, thereby the P-transistor 85 being set in the OFF state and the N-transistor 87 being set in the ON state.

In the same manner, when all of the N-transistors 87 respectively provided in the other sense amplifiers A3-2~A3-4 are set in the ON state, the transition detection signal /DT3C outputted from each of the nodes n/DT3C of the sense amplifiers A3-1~A3-4 is set at the L-level. Each of P-transistors 85 and N-transistors 87 respectively provided in the sense amplifiers A3-1~A3-4 functions as a four-input NAND gate. The L-level transition detection signal /DT3C is inputted to each node n/DT1 of output circuits OUT1-1~OUT1-4. With this, output circuits OUT1-1~OUT1-4 receive the read data RD1~RD4, respectively.

When the sense amplifier is set in the reset state (signal WE or signal ATD=H-level), the node n32 of the read data transition detection circuit 83 in each of sense amplifiers A3-1~A3-4 is set at the L-level while the transition detection signal /DT3C is reset to the H-level.

As describe above, according to the DRAM 81 of the third embodiment, the transition detection signal /DT3C is set at the L-level when all the sense amplifier A3-1~A3-4 have outputted the read data RD1~RD4. With this, output circuits OUT1-1~OUT1-4 receives the read data RD1~RD4, respectively. On the other hand, when any one of sense amplifiers A3-1~A3-4 is reset, the transition detection signal /DT3C is reset to the H-level. Thus, it does not occur that the read data RD1~RD4 are inputted to output circuits OUT1-1~OUT1-4, respectively. In other words, the input operation of the read data RD1~RD4 to output circuits OUT1-1~OUT1-4 is controlled by the control signal /DT3C. Therefore, despite that the DRAM 81 employs a single data line structure, it become possible to read the data without providing any delay circuit for delaying the signal ATD in order to ensuring the timing margin.

Furthermore, in the DRAM 81 according to the third embodiment, the number of wirings between each of sense amplifier A3-1~A3-4 and each of output circuits OUT1-1~OUT1-4 is reduced in comparison with the DRAM 1 according to the first embodiment. Therefore, the DRAM 81 is advantageous in case of executing the multi-bit wiring such as x 16-bit wiring, x 32-bit wiring and so on. Still further, comparing with the DRAM 61 according to the second embodiment, the circuit relating to the signal control is more simplified, for instance the control circuit CNT 2 of the DRAM 61 has been removed.

In the next, a DRAM 91 as a semiconductor memory, according to the fourth embodiment of the invention will be described with reference to FIGS. 9 through 12 in the following. In the following description, however, it is assumed that the DRAM 91 has a memory structure of n words X 4 bits.

The DRAM 91 includes 4 sense amplifiers A4-1, A4-2, A4-3 and A4-4, 4 output circuits OUT4-1, OUT4-2, OUT4-3 and OUT4-4, and a control circuit CNT4.

Sense amplifiers A4-1~A4-4 are constituted to receive the signal WE and the signal ATD inputted through their nodes nWE and nATD, respectively. Sense amplifiers A4-1~A4-4 are constituted to receive complementary memory cell data BD1, /BD1, . . . and BD4, /BD4 inputted through their nodes nBD and n/BD, respectively. The node n/DT4A of the sense amplifier A4-1 is connected with the node n/DT4C of the control circuit CNT4 while the node n/DT4B of the sense amplifier A4-1 is connected with the node n/DT4A of the sense amplifier A4-2. The node n/DT4B of the sense amplifier A4-2 is connected with the node n/DT4A of the sense amplifier A4-3 while the node n/DT4B of the sense amplifier A4-3 is connected with the node n/DT4A of the sense amplifier A4-4. The node n/DT4B of the sense amplifier A4-4 is grounded.

The control circuit CNT4 is constituted to receive the signal WE inputted through its node nWE and also the signal ATD inputted through its node nATD. Furthermore, the node n/RS4A of the control circuit CNT4 is constituted to receive a reset signal /RS4A outputted from the sense amplifiers A4-1~A4-4.

Output circuits OUT4-1~OUT4-4 are constituted to receive the signal WE inputted through their nodes nWE, respectively. Each node n/DT4D of output circuits OUT4-1~OUT4-4 is connected with the node n/DT4D of the control circuit CNT4. Each node n/RS4B of the output circuits OUT4-1~OUT4-4 is connected with the node n /RS4B of the control circuit CNT4. Output circuits OUT4-1~OUT4-4 are constituted to receive write data WD1, WD2, WD3 and WD4 inputted through their nodes nWD, respectively.

The sense amplifier A4-1 is constituted to supply a read data RD1 to the output circuit OUT4-1. The sense amplifier A4-2 is constituted to supply a read data RD2 to the output circuit OUT4-2. The sense amplifier A4-3 is constituted to supply a read data RD3 to the output circuit OUT4-3. The sense amplifier A4-4 is constituted to supply a read data RD4 to the output circuit OUT4-4.

Output circuits OUT4-1~OUT4-4 are constituted to receive the output control signal OE inputted through their nodes nOE, respectively, and they output the output data DO1~DO4 from their output nodes nDO, respectively, based on the output control signal OE.

In the next, there will be described the structure of sense amplifiers A4-1~A4-4. Since these sense amplifiers have an almost identical structure, the sense amplifier A4-1 will be described as a representative of them with reference to FIG. 10.

The sense amplifier A4-1 has such a structure that is obtained by substituting a read data transition detection circuit 93 for the read data transition detection circuit 13 instead of the sense amplifier A1-1 as shown in FIG. 2.

The read data /RD1 outputted from the inverter 9 and the read data RD1 outputted from the inverter 11 are inputted to the read data transition detection circuit 93.

The read data transition detection circuit 93 includes a NOR gate 15, an inverter 65, a P-transistor 95 and an N-transistor 87. One input terminal of the NOR gate 15 is connected with the output terminal of the inverter 9 while the other input terminal of the NOR gate 15 is connected with the output terminal of the inverter 11. The output terminal of the NOR gate 15 is connected with the input terminal of an inverter 65, and the output terminal of the inverter 65 is connected with each gate of P-transistor 95 and the N-transistor 87 through a node n42. The source of the P-transistor 95 is connected with the node n/RS4A and its drain is grounded. The source of the N-transistor 87 is connected with the node n/DT4B and its drain is connected with the node n/DT4A.

Next, there will be described the structure of the output circuit OUT4-1~OUT 4-4. Since these output circuits have an almost identical structure, the output circuit OUT4-1 will be described as a representative of them with reference to FIG. 11. The output circuit OUT4-1 can be obtained by adding a NAND gate 97 and an inverter 99 to the output circuit OUT1-1 as shown in FIG. 3.

One input terminal of the NAND gate 97 is connected with the node n/RS4B while the other input terminal is connected with the node nOE. The output terminal of the NAND gate 97 is connected with the input terminal of the inverter 99.

In case of the output circuit OUT1-1, the node nOE is connected with the other input terminal of the NAND gate 54 and with the other input terminal of the NAND gate 55, both NAND gates being provided in the data output portion 51. However, in case of this output circuit OUT4-1, the output terminal of the inverter 99 is connected with the other input terminal of the NAND gate 54 and with the other input terminal of the NAND gate 55, both NAND gates being provided in the data output portion 51.

Figure 12:
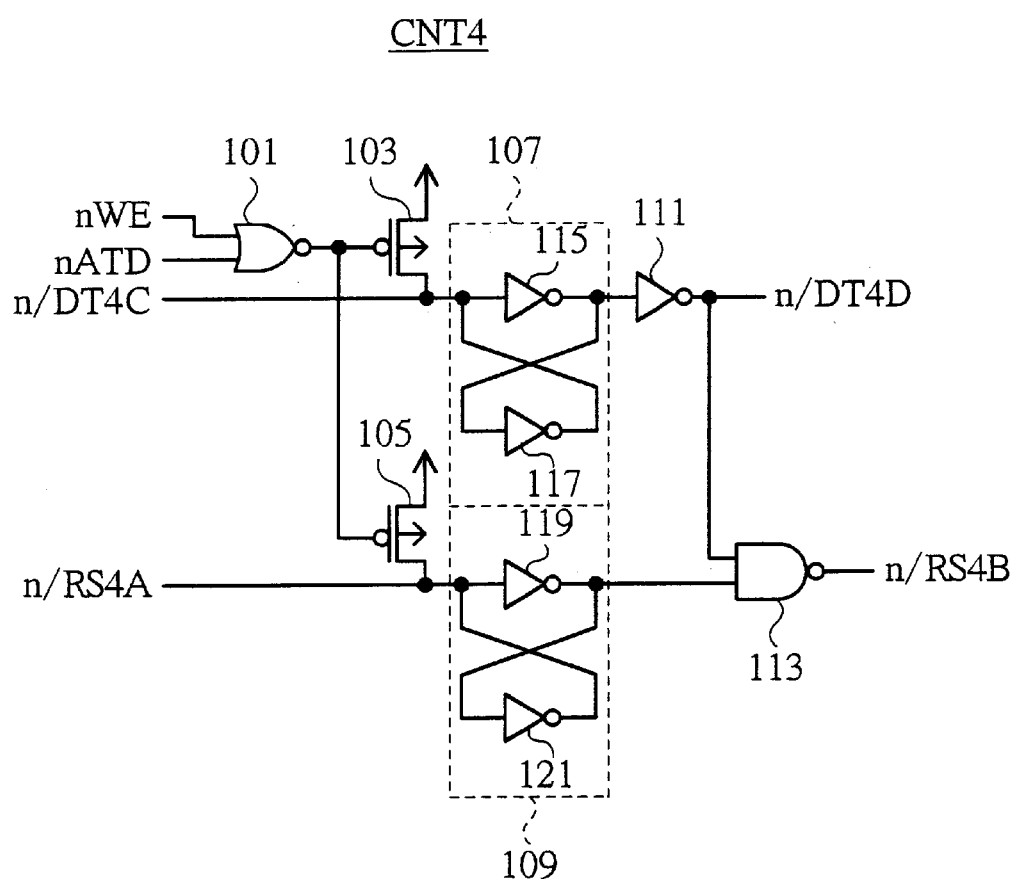
FIG. 12 a circuit diagram showing the structure of a control circuit prepared in the DRAM shown in FIG. 9.

In the next, the structure of the control circuit CNT4 is described with reference to FIG. 12. The control circuit CNT4 includes a NOR gate 101, P-transistors 103 and 105, latch portions 107 and 109, an inverter 111 and NAND gate 113. The latch portion 107 further includes inverters 115 and 117 and the latch portion 109 further includes inverters 119 and 121.

One input terminal of the NOR gate 101 is connected with the node nWE while the other input terminal of the same is connected with the node nATD. The output terminal of the NOR gate 101 is connected with each gates of the P-transistors 103 and 105. The source of the P-transistor 103 is connected with a power source while the drain of the same is connected with the node n/DT4C. The source of the P-transistor 105 is connected with a power source while the drain of the same is connected with the node n/RS4A.

With the node n/DT4C are connected the input terminal of the inverter 115 and the output terminal of the inverter 117, both inverter being provided in the latch portion 107. The output terminal of the inverter 115 and the input terminal of the inverter 117 are connected with the input terminal of the inverter 111, of which the output terminal is connected with the node n/DT4D.

With the node n/RS4A are connected the input terminal of inverter 119 and output of terminal of inverter 121 which are provided in the latch portion 109. The output terminal of the inverter 119 and the input terminal of the inverter 121 are connected with one input terminal of the NAND gate 113. The other input terminal of the NAND gate 113 is connected with the node n/DT4D, and the output thereof is connected with the node n/RS4B.

The operation of the DRAM 91 as constituted above according to the fourth embodiment will now be explained in the following.

When the sense amplifier A4-1 starts its operation of sense amplification operation, one of nodes n10 and n11 both of which were at the H-level before the operation starts, is set at the L-level by means of the current mirror circuit 3 and the current mirror circuit 5. In consequence of this level change of the node n10 or n11, the NOR gate 15 outputs the L-level signal, thereby both of P- and N-transistors 95 and 87 being equally set in the ON state.

As at least one of P-transistors 95 provided in sense amplifiers A4-1~A4-4 goes into the on state, the reset signal /RS4A inputted to the node n/RS4A of the control circuit CNT4 is set at the L-level. Receiving this L-level reset signal /RS4A, the control circuit CNT4 outputs the L-level reset signal /RS4B from the node n/RS4B. At this time, the control circuit CNT4 outputs the H-level transition detection signal /DT4D from the node n/DT4D. When the L-level reset signal /RS4B is inputted to the node n/RS4B of each output circuit OUT4-1~OUT4-4, the node n16 in the output portion 51 of each output circuit OUT4-1~OUT4-4 is set at the H-level while the node n17 of the same is set at the L-level. With this, the P- and the N-transistors 57 and 58 of each output circuit OUT4-1~OUT4-4 are turned off, and the output node nDO of each output circuit OUT4-1~OUT4-4 comes in the high impedance state.

Contrary to this, when all the N-transistors 87 provided in sense amplifiers A4-1~A4-4 are set in the ON state, the transition detection signal /DT4C inputted to the node n/DT4C of the control circuit CNT4 is set at the L-level. Receiving this L-level transition detection signal /DT4C, the control circuit CNT4 outputs the L-level transition detection signal /DT4D to the all the output circuits OUT4-1~OUT4-4. Each output circuit OUT4-1~OUT4-4 receives the read data RD1~RD4 in response to the L-level transition detection signal /DT4D. At this time, the node n/DT4D of the control circuit CNT 4 is set at the L-level, so that the node n/RS4B is set at the H-level by the NAND gate 113. Furthermore, since the reset signal /RS4B outputted from the node n/RS4B of the control circuit CNT4 is set at the H-level, NAND gates 54 and 55 in the data output portion 51 of each output circuit OUT4-1~OUT4-4 operate in correspondence with the level of the data RD1~RD4. As a result, the output node nDO of each output circuit OUT4-1~OUT4-4 is released from the high impedance state and outputs the output data DO1~DO4 having a predetermined level.

As the sense amplifier is in the reset state (signal WE or signal ATD=H-level), the node n42 of each sense amplifier A4-1~A4-4 is set at the L-level while the transition detection signal /DT4C, /DT4D, and the reset signal /RS4A are reset to the H-level.

As described above, according to the DRAM 91 of the fourth embodiment, each output node nDO of output circuits OUT4-1~OUT44 is in the high impedance state all the time until all the outputs from the other sense amplifiers are decided, after there has been decided the output from any one of sense amplifiers, in other words, while the reset signal /RS4B remains at the L-level. On the other hand, after the outputs from all the sense amplifiers have been decided, in other words, while the transition detection signal /DT4D remains at the L-level, output circuits OUT4-1~OUT4-4 output the output data DO1~DO4, respectively. Therefore, despite that the DRAM 91 employs a single data line structure, it is not required to provide any timing margin. Furthermore, since the current passing through the output circuit OUT4-1~OUT4-4 is reduced, there is effectively prevented generation of the noise that might be caused when outputting the output data DO1~DO4.

[Fifth Preferred Embodiment]

Figure 13:
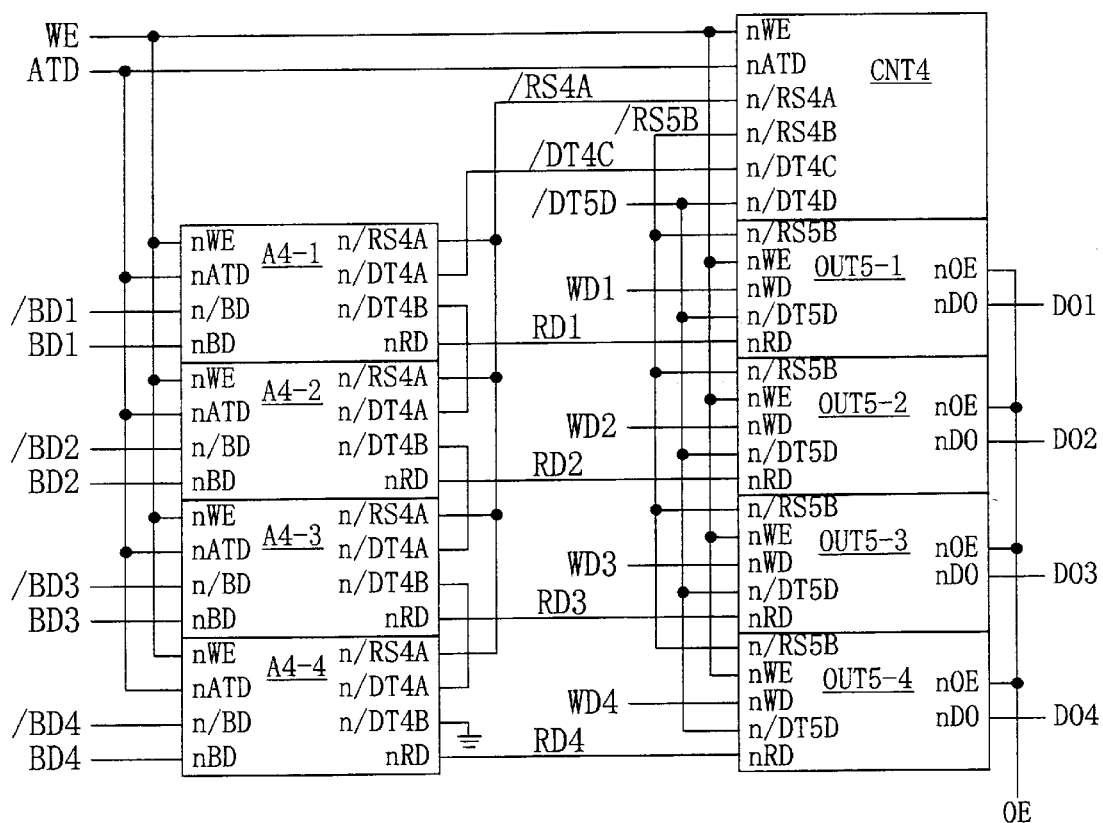
FIG. 13 is a block diagram showing the structure of a DRAM according to the fifth embodiment of the invention.
Figure 14:
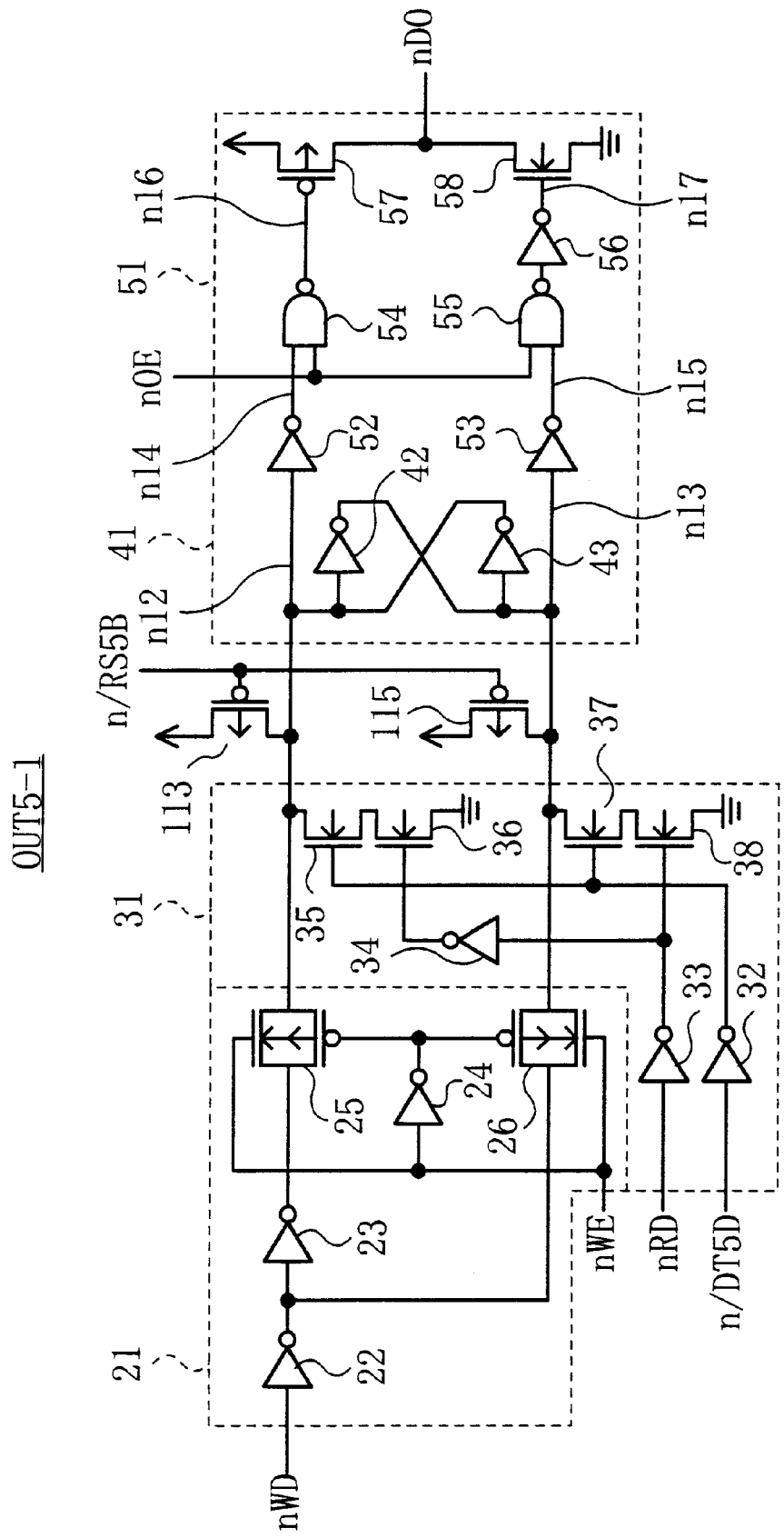
FIG. 14 is a circuit diagram showing the structure of a output circuit prepared in the DRAM shown in FIG. 13.

In the next, a DRAM 111 as a semiconductor memory, according to the fifth embodiment of the invention will be described with reference to FIGS. 13 and 14 in the following. In the following description, however, it is assumed that the DRAM 111 has a memory structure of n words X 4 bits.

The DRAM 111 includes 4 sense amplifiers A4-1, A4-2, A4-3 and A4-4, 4 output circuits OUT5-1, OUT5-2, OUT5-3 and OUT5-4, and a control circuit CNT4.

Sense amplifiers A4-1~A4-4 are constituted to receive the signal WE and the signal ATD inputted through their nodes nWE and nATD, respectively. Sense amplifiers A4-1~A4-4 are constituted to receive complementary memory cell data BD1, /BD1, . . . and BD4, /BD4 inputted through their nodes nBD and n/BD, respectively.

The node n/DT4A of the sense amplifier A4-1 is connected with the node n/DT4C of the control circuit CNT4 while the node n/DT4B of the sense amplifier A4-1 is connected with the node n/DT4A of the sense amplifier A4-2. The node n/DT4B of the sense amplifier A4-2 is connected with the node n/DT4A of the sense amplifier A4-3 while the node n/DT4B of the sense amplifier A4-3 is connected with the node n/DT4A of the sense amplifier A4-4. The node n/DT4B of the sense amplifier A4-4 is grounded.

The control circuit CNT4 is constituted to receive the signal WE inputted through its node nWE and also the signal ATD inputted through its node nATD. Furthermore, the node n/RS4A of the control circuit CNT4 is constituted to receive a reset signal /RS4A outputted from the sense amplifiers A4-1~A4-4.

Output circuits OUT5-1~OUT5-4 are constituted to receive the signal WE inputted through their nodes nWD. Each node n/DT5D of output circuits OUT5-1~OUT5-4 is connected with the node n/DT4D of the control circuit CNT4. Each node n/RS5B of the output circuits OUT5-1~OUT5-4 is connected with the node /RS4B of the control circuit CNT4. Output circuits OUT5-1~OUT5-4 are constituted to receive write data WD1, WD2, WD3 and WD4 inputted through their nodes nWD, respectively.

The sense amplifier A4-1 is constituted to supply a read data RD1 to the output circuit OUT5-1. The sense amplifier A4-2 is constituted to supply a read data RD2 to the output circuit OUT5-2. The sense amplifier A4-3 is constituted to supply a read data RD3 to the output circuit OUT5-3. The sense amplifier A4-4 is constituted to supply a read data RD4 to the output circuit OUT5-4.

Output circuits OUT5-1~OUTS-4 are constituted to receive the output control signal OE inputted through their nodes nOE, respectively, and they output the output data DO1~DO4 from their output nodes nDO, respectively, based on the output control signal OE.

In the next, there will be described the structure of output circuits OUT5-1~OUT5-4. As these output circuits OUT5-1~OUT5-4 have an almost identical structure, the output circuit OUT5-1 will be described as a representative of them with reference to FIG. 14.

The output circuit OUT5-1 has such a structure that is obtained by adding P-transistors 113 and 115 to the output circuit OUT1-1 as shown in FIG. 3.

Each source of P-transistors 113 and 115 is connected with a power source. Each gate of P-transistors 113 and 115 is connected with the node n/RS5B and receives the reset signal /RSB5 which is outputted from the node n/RS4B of the control circuit CNT4. The drain of the P-transistor 113 is connected with the node n12 while the drain of the P-transistor 115 is connected with the node n13. The operation of the DRAM 111 as constituted above according to the fifth embodiment will now be described in the following.

When the sense amplifier A4-1 starts its operation of sense amplification operation, one of nodes n10 and n11 both of which were at the H-level before the operation starts, is set at the L-level by means of the current mirror circuit 3 and the current mirror circuit 5. In consequence of this level change of the node n10 or n11, the NOR gate 15 outputs the L-level signal, thereby both of P- and N-transistors 95 and 87 being equally set in the ON state.

When at least one of P-transistors 95 provided in sense amplifiers A4-1~A4-4 goes into the ON state, the reset signal /RS4A inputted to the node n/RS4A of the control circuit CNT4 is set at the L-level. Receiving this L-level reset signal /RS4A, the control circuit CNT4 outputs the L-level reset signal /RS5B from its node n/RS4B. At this time, the control circuit CNT4 outputs the H-level transition detection signal /DT5D from its node n/DT4D. When the L-level reset signal /RS5B is inputted to the node n/RS5B of each output circuit OUT5-1~OUT5-4, respectively, the nodes n12 and n13 of output circuits OUT5-1~OUT5-4 are set at the H-level, and the node n16 of the same is set at the H-level while the node n17 of the same is set at the L-level. With this, the P- and N-transistors 57 and 58 of each output circuit OUT5-1~OUT5-4 are turned off, and the output node nDO of each output circuit OUT5-1~OUT5-4 is set in the high impedance state.

Contrary to this, when all the N-transistors 87 provided in sense amplifiers A4-1~A4-4 are in the ON state, the transition detection signal /DT4C inputted to the node n/DT4C of the control circuit CNT4 is set at the L-level. Receiving this L-level transition detection signal /DT4C, the control circuit CNT4 outputs the L-level transition detection signal /DT5D to the all the output circuits OUT5-1~OUT5-4. Output circuits OUT5-1~OUT5-4 receive the read data RD1~RD4, respectively, in response to the L-level transition detection signal /DT5D. At this time, the node n/DT4D of the control circuit CNT 4 is set at the L-level, so that the node n/RS4B is set at the H-level by the NAND gate 113. Furthermore, since the reset signal /RS5B outputted from the node n/RS4B of the control circuit CNT4 is set at the H-level, P-transistors 113 and 115 in each output circuit OUT5-1~OUT5-4 are set in the OFF state. As a result, the output node nDO of each output circuit OUT5-1~OUT5-4 is released from the high impedance state and outputs the output data DO1~DO4 having a predetermined level.

When the sense amplifier is in the reset state (signal WE or signal ATD=H-level), the node n42 of each sense amplifier A4-1~A4-4 is set at the L-level while the transition detection signal /DT4C, /DT5D, and the reset signal /RS4A are set at the H-level.

As described above, according to the DRAM 111 of the fifth embodiment, the output node nDO of each output circuit OUT5-1~OUT5-4 is in the high impedance state all the time until all the outputs from the other sense amplifiers are decided after there has been decided the output from any one of sense amplifiers, in other words, while the reset signal /RS5B is at the L-level. On the other hand, after there have been decided the outputs from all the sense amplifiers, in other words, while the transition detection signal /DT5D is at the L-level, output circuit OUT5-1~OUT5-4 output the output data DO1~DO4, respectively. Therefore, despite that the DRAM 111 according to the fifth embodiment employs a single data line structure, it is not required to provide any timing margin for data read. Furthermore, since the current passing through the output circuit OUT5-1~OUT5-4 is reduced, there is effectively prevented generation of the noise that might be caused when outputting the output data DO1~DO4.

Furthermore, each output circuit OUT5-1~OUT5-4 provided in the DRAM 111 according to the fifth embodiment can be constituted by using less number of elements compared with each output circuit OUT4-1~OUT4-4 provided in the DRAM 91 according to the fourth embodiment. Consequently, the circuit scale thereof can be made simple and small and each output circuit OUT5-1~OUT5-4 can receive the read data RD1~RD4 at the high speed.

Figure 15:
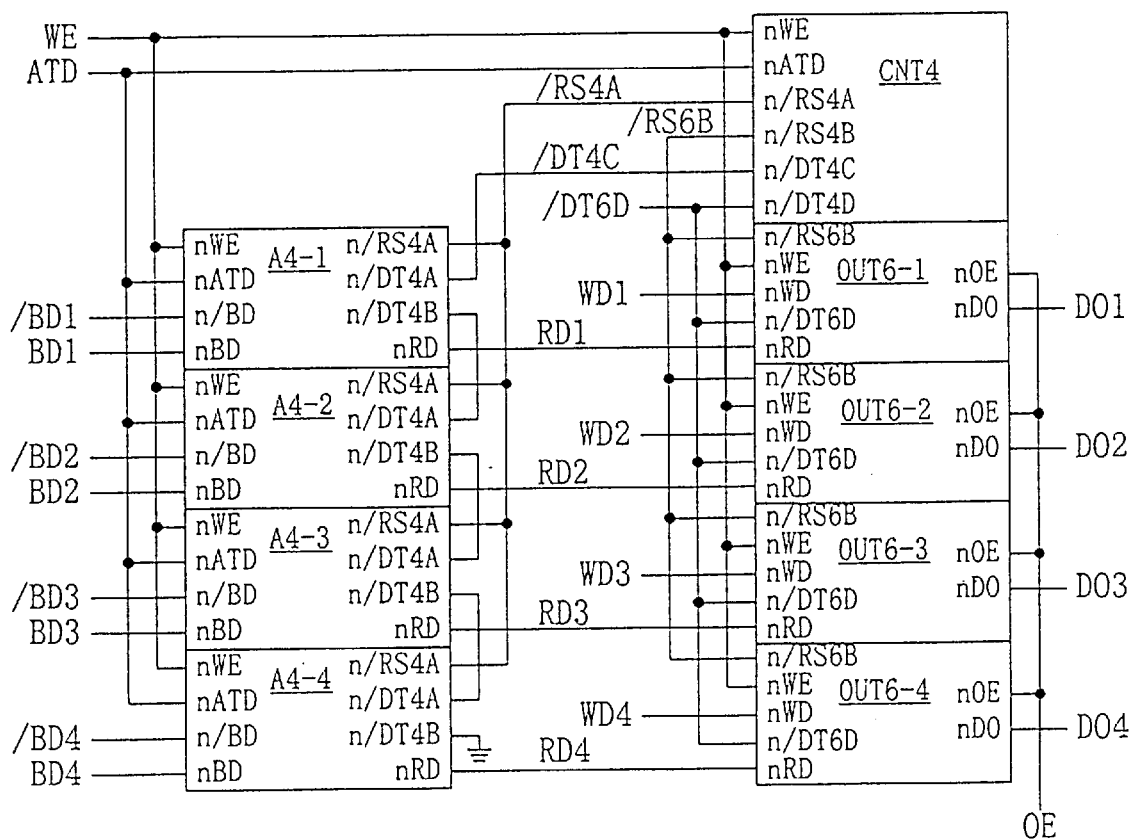
FIG. 15 is a block diagram showing the structure of a DRAM according to the six embodiment of the invention.

In the next, a DRAM 121 as a semiconductor memory, according to the sixth embodiment of the invention will be described with reference to FIGS. 15 and 16 in the following. In the following description, however, it is assumed that the DRAM 121 has a memory structure of n words X 4 bits.

The DRAM 121 includes 4 sense amplifiers A4-1, A4-2, A4-3 and A4-4, 4 output circuits OUT6-1, OUT6-2, OUT6-3 and OUT6-4, and a control circuit CNT4.

Sense amplifiers A4-1~A4-4 are constituted to receive the signal WE and the signal ATD inputted through their nodes nWE and nATD, respectively. Sense amplifiers A4-1~A4-4 are constituted to receive complementary memory cell data BD1, /BD1, ... and BD4, /BD4 inputted through their nodes nBD and n/BD, respectively.

The node n/DT4A of the sense amplifier A4-1 is connected with the node n/DT4C of the control circuit CNT4 while the node n/DT4B of the sense amplifier A4-1 is connected with the node n/DT4A of the sense amplifier A4-2. The node n/DT4B of the sense amplifier A4-2 is connected with the node n/DT4A of the sense amplifier A4-3 while the node n/DT4B of the sense amplifier A4-3 is connected with the node n/DT4A of the sense amplifier A4-4. The node n/DT4B of the sense amplifier A4-4 is grounded.

The control circuit CNT4 is constituted to receive the signal WE from the node nWE and also the signal ATD from the node nATD. Furthermore, the node n/RS4A of the control circuit CNT4 is constituted to receive a reset signal /RS4A outputted respectively from the sense amplifiers A4-1~A4-4.

Output circuits OUT6-1~OUT6-4 are constituted to receive the signal WE inputted through their nodes nWE, respectively. Each node n/DT6D of output circuits OUT6-1~OUT6-4 is connected with the node n/DT4D of the control circuit CNT4. Each node n/RS6B of the output circuits OUT6-1~OUT6-4 is connected with the node /RS4B of the control circuit CNT4. Output circuits OUT6-1~OUT6-4 are constituted to receive write data WD1, WD2, WD3 and WD4 inputted through their nodes nWD, respectively.

The sense amplifier A4-1 is constituted to supply a read data RD1 to the output circuit OUT6-1. The sense amplifier A4-2 is constituted to supply a read data RD2 to the output circuit OUT6-2. The sense amplifier A4-3 is constituted to supply a read data RD3 to the output circuit OUT6-3. The sense amplifier A4-4 is constituted to supply a read data RD4 to the output circuit OUT6-4. Output circuits OUT6-1~OUT6-4 are constituted to receive the output control signal OE inputted through their nodes nOE, respectively, and they output the output data DO1~DO4 from their output nodes nDO, respectively, based on the output control signal OE.

In the next, there will be described the structure of output circuit OUT6-1~OUT6-4. As these output circuits have an almost identical structure, the output circuit OUT6-1 will be described as a representative of them with reference to FIG. 16.

The output circuit OUT6-1 has such a structure that is obtained by substituting an RS flip-flop 123 for the latch portion 41 of the output circuit OUT1-1 as shown in FIG. 3. This RS flip-flop 123 includes a NAND gate 125 and a NAND gate 127.

One input terminal of the NAND gate 125 and one input terminal of the NAND gate 127 are connected with the node n/RS6B, to which the reset signal RS6B is inputted from the control circuit CNT4. The output terminal of the NAND gate 125 is connected with the node n12 and the other input terminal of the NAND gate 127. The output terminal of the NAND gate 127 is connected with the node n13 and the other input terminal of the NAND gate 125.

The operation of the DRAM 121 as constituted above according to the sixth embodiment will now be described in the following.

When the sense amplifier A4-1 starts its operation of sense amplification operation, one of nodes n10 and n11 both of which were at the H-level before the operation starts, is set at the L-level by means of the current mirror circuit 3 and the current mirror circuit 5. In consequence of this level change of the node n10 or n11, the NOR gate 15 outputs the L-level signal, thereby both of P- and N-transistors 95 and 87 being set in the ON state.

When at least one of P-transistors 95 provided respectively in sense amplifiers A4-1~A4-4 is set in the ON state, the reset signal /RS4A inputted to the node n/RS4A of the control circuit CNT4 is set at the L-level. Receiving this L-level reset signal /RS4A, the control circuit CNT4 outputs the L-level reset signal /RS6B from its node n/RS4B. At this time, the control circuit CNT4 outputs the H-level transition detection signal /DT6D from its node n/DT4D. When the L-level reset signal /RS6B is inputted to each node n/RS6B of output circuits OUT6-1~OUT6-4, respective nodes n12 and 13 of output circuits OUT6-1~OUT6-4 are reset to the H-level by the RS flip-flop 123, and the node n16 of the same is set at the H-level while the node n17 of the same is set at the L-level. As a result of this, the P- and N-transistors 57 and 58 of each output circuit OUT6-1~OUT6-4 are turned off, and the output node nDO of each output circuit OUT6-1~OUT6-4 is set in the high impedance state.

Contrary to this, when all the N-transistors 87 provided respectively in sense amplifiers A4-1~A4-4 are set in the ON state, the transition detection signal /DT4C inputted to the node n/DT4C of the control circuit CNT4 is set at the L-level. Receiving this L-level transition detection signal /DT4C, the control circuit CNT4 outputs the L-level transition detection signal /DT6D to the all the output circuits OUT6-1~OUT6-4. Output circuits OUT6-1~OUT6-4 receive the read data RD1~RD4, respectively, in response to the L-level transition detection signal /DT6D. At this time, the node n/DT4D of the control circuit CNT 4 is set at the L-level, so that the node n/RS4B is set at the H-level by the NAND gate 113. Furthermore, the reset signal /RS6B outputted from the node n/RS4B of the control circuit CNT4 is set at the H-level, the RS flip-flop 123 of each output circuit OUT6-1~OUT6-4 holds the level of the nodes n12 and n13 in correspondence with the level of the read data RD1~RD4. Consequently, the output node nDO of each output circuit OUT6-1~OUT6-4 is released from the high impedance state and outputs the output data DO1~DO4 having a predetermined level.

As the sense amplifier is in the reset state (signal WE or signal ATD=H-level), the node n42 of each sense amplifier A4-1~A4-4 is set at the L-level while the transition detection signal /DT4C, /DT6D, and the reset signal /RS4A are reset to the H-level.

As described above, according to the DRAM 121 of the sixth embodiment, the output node nDO of each output circuit OUT61IOUT6-4 is in the high impedance state all the time until all the outputs from the other sense amplifiers are decided, after the output from any one of sense amplifiers has been decided, in other words, while the reset signal /RS6B remains at the L-level. On the other hand, after there have been decided the outputs from all the sense amplifiers, in other words, while the transition detection signal /DT6D remains at the L-level, output circuits OUT6-1~OUT6-4 output the output data DO1~DO4, respectively. Therefore, despite that the DRAM 121 according to the sixth embodiment employs a single data line structure, it is not required to provide any timing margin for data read. Furthermore, since the current passing through the output circuits OUT6-1~OUT6-4 is reduced, there is effectively prevented generation of the noise that might be caused when outputting the output data DO1~DO4.

Furthermore, each output circuit OUT6-1~OUT6-4 provided in the DRAM 121 according to the sixth embodiment can be constituted with less number of elements compared with each output circuit OUT4-1~OUT4-4 provided in the DRAM 91 according to the fourth embodiment. Consequently, the circuit scale thereof can be made simple and small and output circuits OUT6-1~OUT6-4 can receive the read data RD1~RD4 at the high speed.

Furthermore, according to the DRAM 121 of the sixth embodiment, while the reset signal /RS6B is at the L-level, there is generated no current passing through the RS flip-flop 123 provided in the output circuit OUT6-1~OUT6-4, so that the power consumption can be reduced and the noise can be prevented from being generated.

Figure 17:
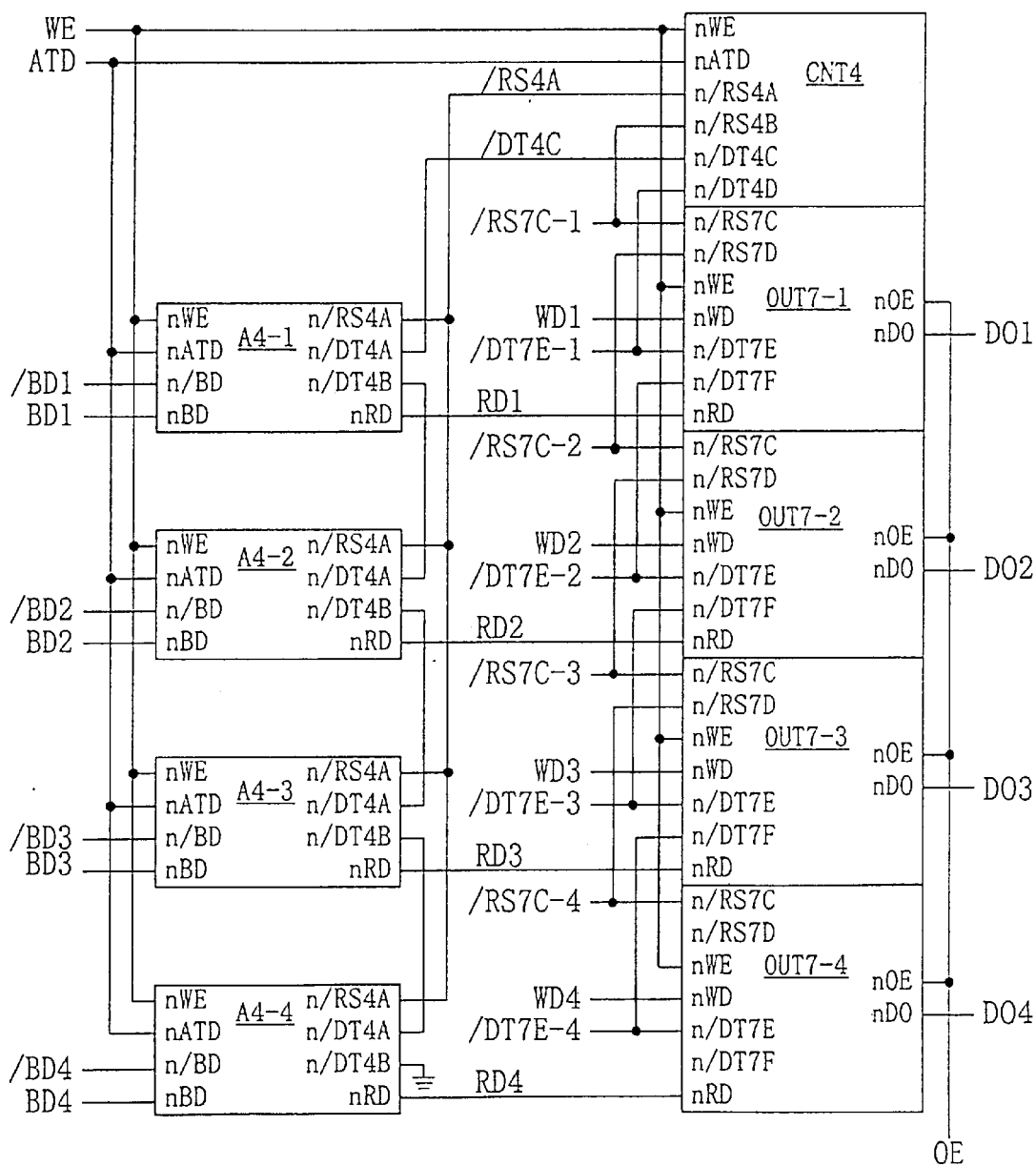
FIG. 17 is a block diagram showing the structure of a DRAM according to the seventh embodiment of the invention.

In the next, a DRAM 131 as a semiconductor memory, according to the seventh embodiment of the invention will be described with reference to FIGS. 17 and 18 in the following. In the following description, however, it is assumed that the DRAM 131 has a memory structure of n words X 4 bits.

The DRAM 131 includes 4 sense amplifiers A4-1, A4-2, A4-3 and A4-4, 4 output circuits OUT7-1, OUT7-2, OUT7-3 and OUT7-4, and a control circuit CNT4.

Sense amplifiers A4-1~A4-4 are constituted to receive the signal WE and the signal ATD inputted their nodes nWE and nATD, respectively. Sense amplifiers A4-1~A4-4 are constituted to receive complementary memory cell data BD1, /BD1, . . . and BD4, /BD4 inputted through their nodes nBD and n/BD, respectively.

The node n/DT4A of the sense amplifier A4-1 is connected with the node n/DT4C of the control circuit CNT4 while the node n/DT4B of the sense amplifier A4-1 is connected with the node n/DT4A of the sense amplifier A4-2. The node n/DT4B of the sense amplifier A4-2 is connected with the node n/DT4A of the sense amplifier A4-3 while the node n/DT4B of the sense amplifier A4-3 is connected with the node n/DT4A of the sense amplifier A4-4. The node n/DT4B of the sense amplifier A4-4 is grounded.

The control circuit CNT4 is constituted to receive the signal WE from the node nWE and also the signal ATD from its node nATD. Furthermore, the node n/RS4A of the control circuit CNT4 is constituted to receive a reset signal /RS4A outputted respectively from the sense amplifiers A4-1~A4-4.

Output circuits OUT7-1~OUT7-4 are constituted to receive the signal WE respectively inputted through their nodes nWE. Output circuits OUT7-1~OUT7-4 are constituted to receive write data WD1, WD2, WD3 and WD4 inputted through their nodes nWD, respectively. The node n/RS4B of the control circuit CNT4 is connected with the node n/RS7C of the output circuit OUT7-1. The node n/RS7D of the output circuit OUT7-1 is connected with the node n/RS7C of the output circuit OUT7-2. The node n/RS7D of the output circuit OUT7-2 is connected with the node n/RS7C of the output circuit OUT7-3. The node n/RS7D of the output circuit OUT7-3 is connected with the node n/RS7C of the output circuit OUT7-4. The node n/RS7D of the output circuit OUT7-4 is made open to the external.

The node n/DT4D of the control circuit CNT4 is connected with the node n/DT7E of the output circuit OUT7-1. The node n/DT7F of the output circuit OUT7-1 is connected with the node n/DT7E of the output circuit OUT7-2. The node n/DT7F of the output circuit OUT7-2 is connected with the node n/DT7E of the output circuit OUT7-3. The node n/DT7F of the output circuit OUT7-3 is connected with the node n/DT7E of the output circuit OUT7-4. The node n/DT7F of the output circuit OUT7-4 is made open to the external.

The sense amplifier A4-1 is constituted to supply a read data RD1 to the output circuit OUT7-1. The sense amplifier A4-2 is constituted to supply a read data RD2 to the output circuit OUT7-2. The sense amplifier A4-3 is constituted to supply a read data RD3 to the output circuit OUT7-3. The sense amplifier A4-4 is constituted to supply a read data RD4 to the output circuit OUT7-4.

Output circuits OUT7-1~OUT7-4 are constituted to receive the output control signal OE inputted through their nodes nOE, respectively, and they output the output data DO1~DO4 from their output nodes nDO, respectively, based on the output control signal OE.

In the next, there will be described the structure of output circuit OUT7-1~OUT7-4. Since these output circuits have an almost identical structure, the output circuit OUT7-1 will be described as a representative of them with reference to FIG. 18.

Figure 16:
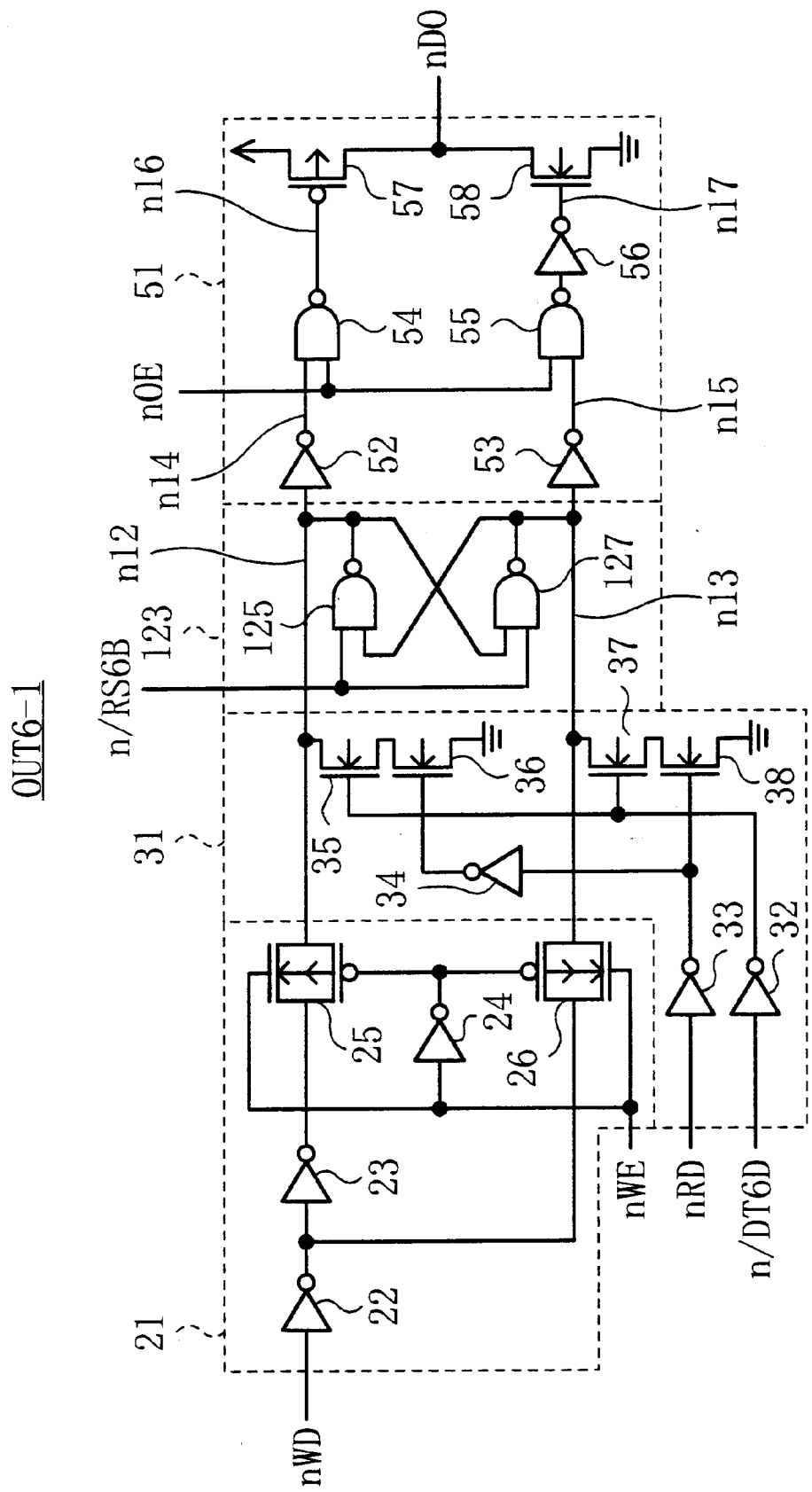
FIG. 16 is a circuit diagram showing the structure of a output circuit prepared in the DRAM shown in FIG. 15.

The output circuit OUT7-1 has such a structure that can be obtained by adding NAND gates 133 and 135 to the output circuit OUT6-1 as shown in FIG. 16.

One input terminal of the NAND gate 133 is connected with the node n12 while the other input terminal of the same is connected with the node nI3. The output terminal of the NAND gate 133 is connected with the node n/RS7D. One input terminal of the NAND gate 135 is connected with the node n/RS7D while the other input terminal of the same is connected with the output terminal of the inverter 32.

The operation of the DRAM 131 as constituted above according to the seventh embodiment will now be described in the following. When the sense amplifier A4-1 starts its operation of sense amplification operation, one of nodes n10 and n11 both of which were at the H-level before the operation starts, is set at the L-level by means of the current mirror circuit 3 and the current mirror circuit 5. In consequence of this level change of the node n10 or n11, the NOR gate 15 outputs the L-level signal, thereby both of P- and N-transistors 95 and 87 going into the ON state.

When at least one of P-transistors 95 provided in sense amplifiers A4-1~A4-4 is set in the ON state, the reset signal /RS4A inputted to the node n/RS4A of the control circuit CNT4 is set at the L-level. Receiving this L-level reset signal /RS4A, the control circuit CNT4 outputs the L-level reset signal /RS7C-1 from its node n/RS4B. At this time, the control circuit CNT4 outputs the H-level transition detection signal /DT7E-1 from its node n/DT4D.

When the L-level reset signal /RS7C-1 is inputted to the node n/RS7C of the output circuit OUT7-1, the nodes n12 and n13 of the output circuit OUT7-1 are reset to the H-level by the RS flip-flop 123, and the node n16 of the same is set at the H-level while the node n17 of the same is set at the L-level. With this, the P- and N-transistors 57 and 58 are turned off, and the output node nDO of the output circuit OUT7-1 goes into the high impedance state. The node n/RS7D of the output circuit OUT7-1 is set at the L-level.

To the node n/RS7C of the output circuit OUT7-2, there is inputted the L-level reset signal /RS7C-2 which is outputted from the node n/RS7D of the output circuit OUT7-1. With this, the output node nDO of the output circuit OUT7-2 goes into the high impedance state. In the same manner, the output circuit OUT7-2 outputs the L-level reset signal /RS7C-3 to the output circuit OUT7-3 from its node n/RS7D, the output circuit OUT7-3 outputs the L-level reset signal /RS7C-4 to the output circuit OUT7-4 from its node n/RS7D. In this way, each output node nDO of all the output circuits OUT7-1~OUT7-4 is once set in the high impedance state.

At this stage, if each level of read data RD1~RD4 outputted respectively from sense amplifiers A4-1~A4-4 is decided, and also all the N-transistors 87 provided respectively in sense amplifiers A4-1~A4-4 go into the ON state, the transition detection signal /DT4C inputted to the node n/DT4C of the control circuit CNT4 is set at the L-level. Subsequently, receiving this L-level transition detection signal /DT4C, the control circuit CNT4 outputs the L-level transition detection signal /DT7E-1 from its node n/DT4D.

This L-level transition detection signal /DT7E-1 is inputted to node n/DT7E of output circuit OUT7-1, and the read data RD1 is inputted to the output circuit OUT7-1. Since the node n/RS4B of the control circuit CNT4 is set at the L-level, the node RS4B of the control circuit is set at the H-level by the NAND gate 113. The reset signal /RS7C-1 outputted from the node n/RS4B of the control circuit CNT4 is set at the H-level, and the RS flip-flop 123 of the output circuit OUT7-1 holds each level of both nodes n12 and n13, corresponding to the level of the read data RD1. As a result, the output node nDO of the output circuit OUT7-1 is released from the high impedance state and outputs the output data DO1 having a predetermined level.

The output circuit OUT7-1 supplies the H-level reset signal /RS7C-2 to the node n/RS7C of the output circuit OUT7-2. The output circuit OUT7-1 also supplies the L-level transition detection signal /DT7E-2 to the node n/DT7E of the output circuit OUT7-2. With this, the RS flip-flop 123 of the output circuit OUT7-2 holds each level of both nodes n12 and n13, corresponding to the level of the read data RD2. As a result, the output node nDO of the output circuit OUT7-2 is released from the high impedance state and outputs the output data DO2 having a predetermined level.

The output circuit OUT7-2 outputs the H-level reset signal /RS7C-3 and the L-level transition detection signal /DT7E-3 to the output circuit OUT7-3, and the output circuit OUT7-3 having received these signals receives the read data RD3 from the sense amplifier A4-3. Furthermore, the output circuit OUT7-3 outputs the H-level reset signal /RS7C-4 and the L-level transition detection signal /DT7E-4 to the output circuit OUT7-4, and the output circuit OUT7-4 having received these signals receives the read data RD4 from the sense amplifier A4-4.

As described above, according to the DRAM 131 of the seventh embodiment, each output node nDO of output circuits OUT7-1~OUT7-4 is set in the high impedance state all the time until all the outputs from the other sense amplifiers are decided, after there has been decided the output from any one of sense amplifiers, in other words, while the reset signal /RS7C-1 remains at the L-level. On the other hand, after there have been decided the outputs from all the sense amplifiers A4-1~A4-4, in other words, while the transition detection signal /DT7E-1 remains at the L-level, the output circuit OUT7-1 outputs the output data DO1 at first.

Then, output circuits OUT7-2~OUT7-4 respectively receive the read data RD2~RD4 based on the decision of the output reset/output in the respective preceding output circuits, and output the output data DO2~DO4.

Therefore, despite that the DRAM 131 according to the seventh embodiment employs a single data line structure, it is not required to provide any timing margin for data read. Furthermore, since the current passing through the output circuit OUT7-1~OUT7-4 is reduced, there is effectively prevented generation of the noise that might be caused when outputting the output data DO1~DO4.

Still further, according to the DRAM 131 of the seventh embodiment, since the output timing of each output data DO1~DO4 is shifted from each other, the noise is more effectively prevented from being generated.

Figure 19:
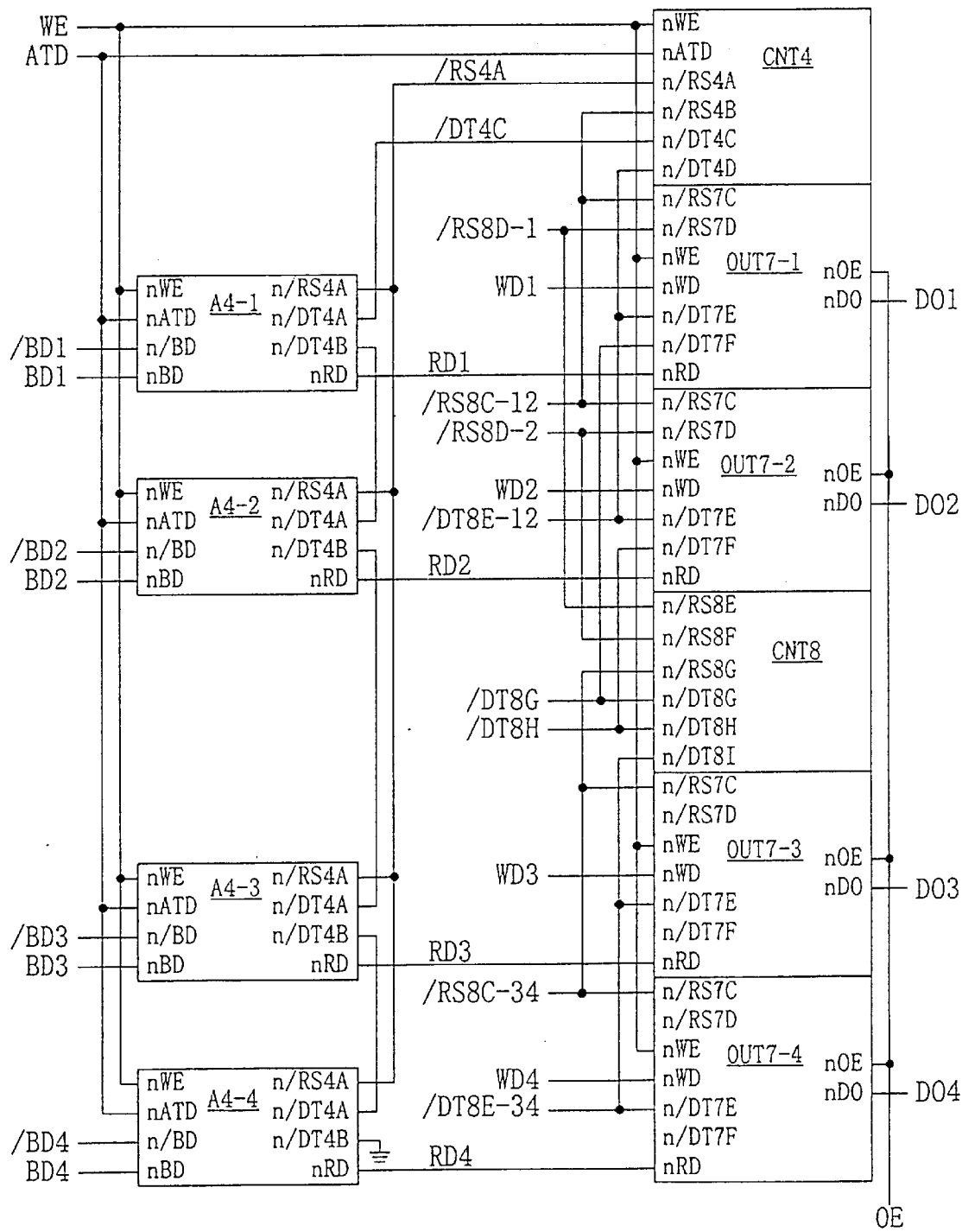
FIG. 19 is a block diagram showing the structure of a DRAM according to the eighth embodiment of the invention.
Figure 20:
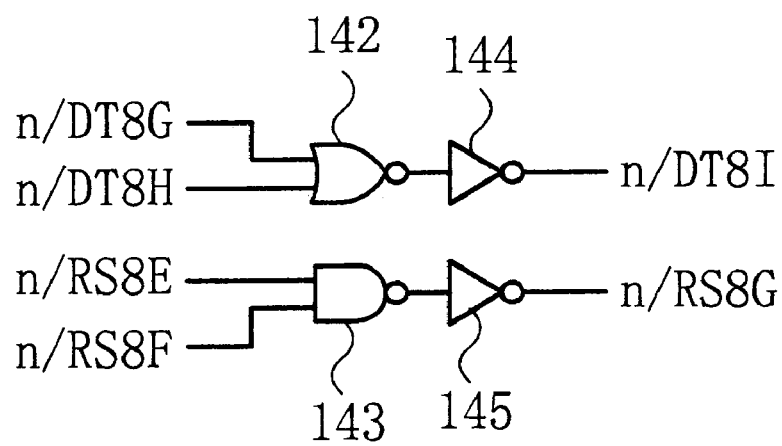
FIG. 20 is a circuit diagram showing the structure of a control circuit prepared in the DRAM shown in FIG. 19.

In the next, a DRAM 141 as a semiconductor memory, according to the eighth embodiment of the invention will be described with reference to FIGS. 19 and 20 in the following. In the following description, however, it is assumed that the DRAM 141 has a memory structure of n words X 4 bits.

The DRAM 141 includes 4 sense amplifiers A4-1, A4-2, A4-3 and A4-4, 4 output circuits OUT7-1, OUT7-2, OUT7-3 and OUT7-4, and two control circuits CNT4 and CNT8.

Sense amplifiers A4-1~A4-4 are constituted to receive the signal WE and the signal ATD inputted through their nodes nWE and nATD, respectively. Sense amplifiers A4-1~A4-4 are constituted to receive complementary memory cell data BD1, /BD1, . . . and BD4, /BD4 inputted through their nodes nBD and n/BD, respectively.

The node n/DT4A of the sense amplifier A4-1 is connected with the node n/DT4C of the control circuit CNT4 while the node n/DT4B of the sense amplifier A4-1 is connected with the node n/DT4A of the sense amplifier A4-2. The node n/DT4B of the sense amplifier A4-2 is connected with the node n/DT4A of the sense amplifier A4-3 while the node n/DT4B of the sense amplifier A4-3 is connected with the node n/DT4A of the sense amplifier A4-4. The node n/DT4B of the sense amplifier A4-4 is grounded.

The control circuit CNT4 is constituted to receive signals WE and ATD inputted through its nodes nWE and nATD, respectively. Furthermore, the node n/RS4A of the control circuit CNT4 is constituted to receive a reset signal /RS4A outputted from each of sense amplifiers A4-1~A4-4.

Output circuits OUT7-1~OUT7-4 are constituted to receive the signal WE inputted through their nodes nWE, respectively. Also, output circuits OUT7-1~OUT7-4 are constituted to receive write data WD1, WD2, WD3 and WD4 inputted through their nodes nWD, respectively.

The node n/RS4B of the control circuit CNT4 is connected with the node n/RS7C of the output circuit OUT7-1 and the node n/RS7C of the output circuit OUT7-2. The node n/DT4D of the control circuit CNT4 is connected with the node n/DT7E of the output circuit OUT7-1 and the node n/DT7E of the output circuit OUT7-2.

The node n/RS7D of the output circuit OUT7-1 is connected with the node n/RS8E of the control circuit CNT8, and the node n/DT7F of the output circuit OUT7-1 is connected with the node n/DT8G of the control circuit CNT8. The node n/RS7D of the output circuit OUT7-2 is connected with the node n/RS8F of the control circuit CNT8, and the node n/DT7F of the output circuit OUT7-2 is connected with the node n/DT8H of the control circuit CNT8.

The node n/RS8G of the control circuit CNT8 is connected with the node n/RS7C of the output circuit OUT7-3 and the node n/RS7C of the output circuit OUT7-4. The node n/DT8I of the control circuit CNT8 is connected with the node n/DT7E of the output circuit OUT7-3 and the node n/DT7E of the output circuit OUT7-4. Respective nodes n/RS7D and n/DT7F of the output circuits OUT7-3 and OUT7-4 are made to open to the external.

The sense amplifier A4-1 is constituted to supply a read data RD1 to the output circuit OUT7-1. The sense amplifier A4-2 is constituted to supply a read data RD2 to the output circuit OUT7-2. The sense amplifier A4-3 is constituted to supply a read data RD3 to the output circuit OUT7-3. The sense amplifier A4-4 is constituted to supply a read data RD4 to the output circuit OUT7-4.

Output circuits OUT7-1~OUT7-4 are constituted to receive the output control signal OE inputted through their nodes nOE, respectively, and they output the output data DO1~DO4 from their output nodes nDO, respectively, based on the output control signal OE.

In the next, the constitution of the control circuit CNT8 will be described with reference to FIG. 20.

The control circuit CNT8 includes a NOR gate 142, a NAND gate 143, and two inverters 144 and 145. One input terminal of the NOR gate 142 is connected with the node n/DT8G while the other input terminal of the same is connected with the node n/DT8H. The output terminal of the NOR gate 142 is connected with the input terminal of the inverter 144, of which the output terminal is connected with the node n/DT8I.

One input terminal of the NAND gate 143 is connected with the node n/RS8E while the other input terminal of the same is connected with the node n/RS8F. The output terminal of the NAND gate 143 is connected with the input terminal of the inverter 145, of which the output terminal is connected with the node n/RS8G.

The operation of the DRAM 141 as constituted above according to the eighth embodiment will now be described in the following.

When the sense amplifier A4-1 starts its operation of sense amplification, one of nodes n10 and n11 both of which were at the H-level before the operation starts, is set at the L-level by means of the current mirror circuit 3 and the current mirror circuit 5. In consequence of this level change of the node n10 or n11, the NOR gate 15 outputs the L-level signal, thereby both of P- and N-transistors 95 and 87 being set in the ON state.

When at least one of P-transistors 95 provided in sense amplifiers A4-1~A4-4 goes into the ON state, the reset signal /RS4A inputted to the node n/RS4A of the control circuit CNT4 is set at the L-level. Receiving this L-level reset signal /RS4A, the control circuit CNT4 outputs the L-level reset signal /RS8C-12 from its node n/RS4B. At this time, the control circuit CNT4 outputs the H-level transition detection signal /DT8E-12 from the node n/DT4D.

When the L-level reset signal /RS8C-12 is inputted to the node n/RS7C of the output circuit OUT7-1 and the node n/RS7C of the output circuit OUT7-2, respective nodes n12 and n13 of output circuits OUT7-1 and OUT7-2 are reset to the H-level, and the node n16 is set at the H-level while the node n17 is set at the L-level. Therefore, the P and N-transistors 57 and 58 are turned off, and each output node nDO of output circuits OUT7-1 and OUT7-2 goes into the high impedance state. Also, each node n/RS7D of output circuits OUT7-1 and OUT7-2 is set at the L-level.

To the node n/RS8E of the control circuit CNT8, there is inputted the L-level reset signal /RS8D-1 which is outputted from the node n/RS7D of the output circuit OUT7-1. On one hand, the L-level reset signal /RS8D-2 which is outputted from the node n/RS7D of the output circuit OUT7-2, is inputted to the node n/RS8F of the control circuit CNT8. With this, the control circuit CNT8 supplies the L-level reset signal /RS8C-34 from its node n/RS8G to both of output circuit OUT7-3 and OUT7-4, in synchronization with the earlier input timing which is selected from the input timing of the L-level reset signal /RS8D-1 and the same of the L-level reset signal /RS8D-2. Receiving this L-level reset signal /RS8C-34, each output node nDO of output circuit OUT7-3 and OUT7-4 goes into in the high impedance state. In this way, each output node nDO of all the output circuits OUT7-1~OUT7-4 is once set in the high impedance state.

At this stage, if each level of read data RD1~RD4 outputted from sense amplifiers A4-1~A4-4 is decided, and also all the N-transistors 87 provided in sense amplifiers A4-1~A4-4 are set in the ON state, the transition detection signal /DT4C inputted to the node n/DT4C of the control circuit CNT4 is set at the L-level. Subsequently, receiving this L-level transition detection signal /DT4C, the control circuit CNT4 outputs the L-level transition detection signal /DT8E-12 from its node n/DT4D.

This L-level transition detection signal /DT8E-12 is inputted to each node n/DT7E of output circuits OUT7-1 and OUT7-2, and the output circuit OUT7-1 receives the read data RD1 while the output circuit OUT7-2 receives the read data RD2. Since the node n/DT4D of the control circuit CNT4 is set at the L-level, the node n/RS4B of the control circuit CNT4 is set at the H-level by the NAND gate 113. The reset signal /RS8C-12 outputted from the node n/RS4B of the control circuit CNT4 is set at the H-level, and the RS flip-flop 123 of output circuit OUT7-1 holds the level of both nodes n12 and n13, corresponding to the level of the read data RD1. In the same manner, the RS flip-flop 123 of output circuit OUT7-2 holds the level of both nodes n12 and n13, corresponding to the level of the read data RD2. As a result, each output node nDO of the output circuits OUT7-1 and OUT-2 is released from the high impedance state, thus respectively outputting the output data DO1 and DO2 having a predetermined level.

Thus, the node n/RS7D of output circuit OUT7-1 is set at the H-level, and the H-level reset signal /RS8D-1 is supplied to the control circuit CNT8. The node n/DT7F of the output circuit OUT7-1 is set at the L-level, and the L-level transition detection signal /DT8G is supplied to the control circuit CNT8.

In the same manner, the node n/RS7D of the output circuit OUT7-2 is set at the H-level, and the H-level reset signal /RS8D-2 is supplied to the control circuit CNT8. The node n/DT7F of the output circuit OUT7-2 is set at the L-level, and the L-level transition detection signal /DT8H is supplied to the control circuit CNT8.

Receiving both H-level reset signals /RS8D-1 and /RS8D-2 as inputted, the control circuit CNT8 outputs the H-level reset signal /RS8C-34 to each of output circuits OUT7-3 and OUT7-4. Also, receiving both L-level transition detection signals /DT8G and /DT8H as inputted, the control circuit CNT8 outputs the L-level transition detection signal /DT8E-34 to each of output circuits OUT7-3 and OUT7-4.

Receiving the H-level reset signal /RS8C-34 and the L-level transition detection signal /DT8E-34, the output circuit OUT7-3 receives the read data RD3 from the sense amplifier A4-3. In the same manner, receiving the H-level reset signal /RS8C-34 and the L-level transition detection signal /DT8E-34, the output circuit OUT7-4 receives the read data RD4 from the sense amplifier A4-4.

As described above, in the DRAM 141 according to the eighth embodiment, the first output circuit group is formed by output circuits OUT7-1 and OUT7-2 while the second output circuit group is formed by output circuits OUT7-3 and OUT7-4.

At first, the output node nDO of all the output circuit OUT7-1~OUT7-4 is set in the high impedance state, and when there have been decided all the outputs of sense amplifiers A4-1~A4-4, output data DO1 and DO2 are outputted from output circuits OUT7-1 and OUT7-2, respectively.

Until there is decided the output data DO1 and DO2 of output circuits OUT7-1 and OUT7-2 in the first output circuit group, each output of output circuits OUT7-3 and OUT7-4 in the second output group is set in the high impedance state. After that, when there have been decided output data DO1 and DO2 of output circuits OUT7-1 and OUT7-2 in the first output circuit group, each output node nDO of output circuits OUT7-3 and OUT7-4 in the second output group is released from the high impedance state, thereby output data DO3 and DO4 being outputted.

Therefore, despite that the DRAM 141 according to the eighth embodiment employs a single data line structure, it is not required to provide any timing margin for data read. Furthermore, since the current passing through the output circuit OUT7-1~OUT7-4 is reduced, there is effectively prevented generation of the noise that might be caused when outputting the output data DO1~DO4.

Still further, since the DRAM 141 according to the eighth embodiment operates such that after one of output circuit groups has decided its output, the other of the same starts the operation of outputting the data, output circuit groups may shift their output timing, respectively. Therefore, even in case of employing the multi-bit structure (x 16-bit, x 32-bit), it is possible to prevent not only output delay of the output data but also generation of the noise.

Figure 21:
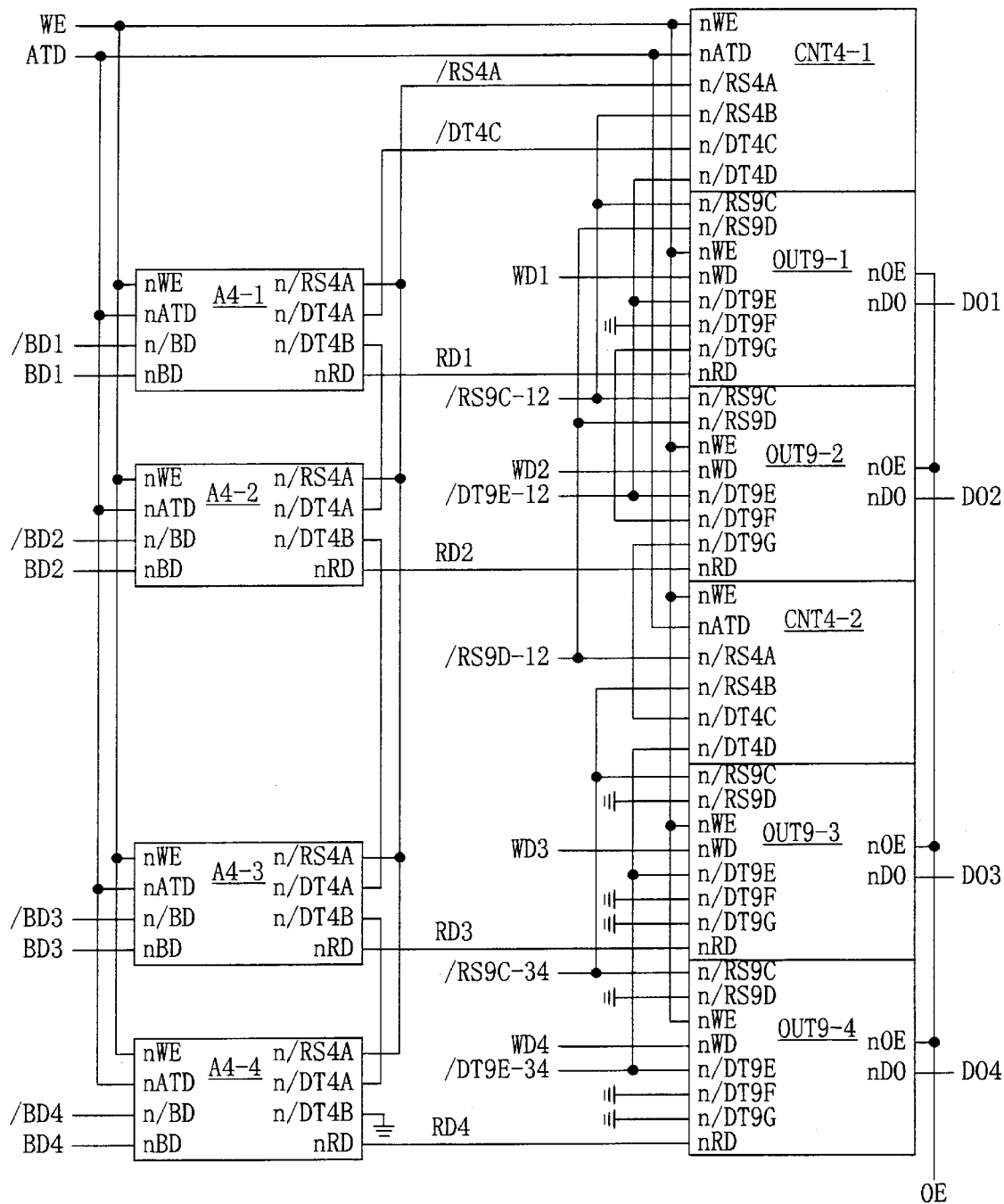
FIG. 21 is a block diagram showing the structure of a DRAM according to the ninth embodiment of the invention.
Figure 22:
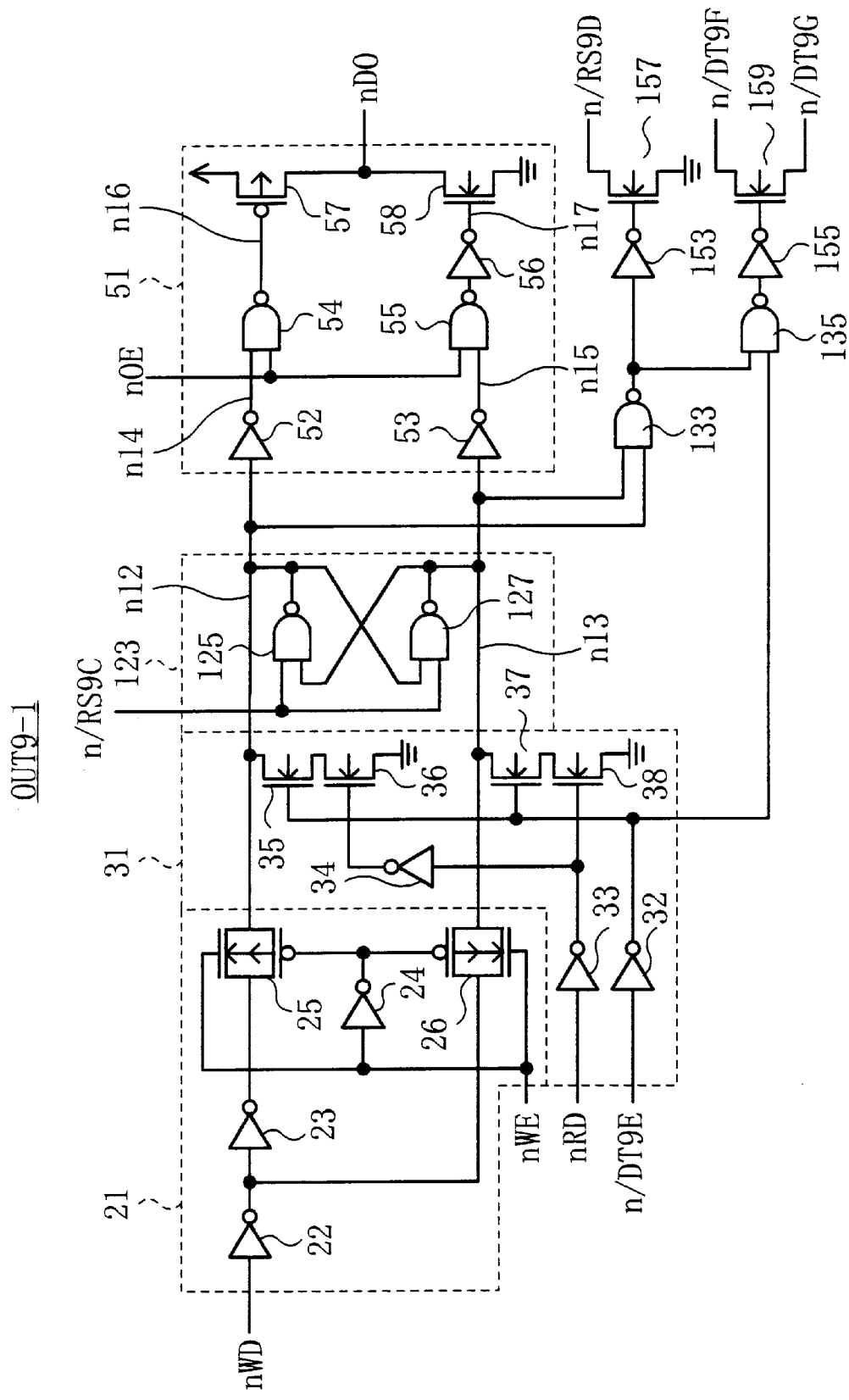
FIG. 22 is a circuit diagram showing the structure of a output circuit prepared in the DRAM shown in FIG. 21.

In the next, a DRAM 151 as a semiconductor memory, according to the ninth embodiment of the invention will be described with reference to FIGS. 21 and 22 in the following. In the following description, however, it is assumed that the DRAM 151 has a memory structure of n words X 4 bits.

The DRAM 151 includes 4 sense amplifiers A4-1, A4-2, A4-3 and A4-4, 4 output circuits OUT9-1, OUT9-2, OUT9-3 and OUT9-4, and two control circuits CNT4-1 and CNT4-2. These control circuits CNT4-1 and CNT4-2 have the almost same constitution as the before-mentioned control circuit CNT4.

Sense amplifiers A4-1~A4-4 are constituted to receive the signal WE and the signal ATD inputted through their nodes nWE and nATD, respectively. Sense amplifiers A4-1~A4-4 are constituted to receive complementary memory cell data BD1, /BD1, ... and BD4, /BD4 inputted through their nodes nBD and n/BD, respectively.

The node n/DT4A of the sense amplifier A4-1 is connected with the node n/DT4C of the control circuit CNT4-1 while the node n/DT4B of the sense amplifier A4-1 is connected with the node n/DT4A of the sense amplifier A4-2. The node n/DT4B of the sense amplifier A4-2 is connected with the node n/DT4A of the sense amplifier A4-3 while the node n/DT4B of the sense amplifier A4-3 is connected with the node n/DT4A of the sense amplifier A4-4. The node n/DT4B of the sense amplifier A4-4 is grounded.

Control circuits CNT4-1 and CNT4-2 are constituted to receive signals WE and ATD inputted through their nodes nWE and nATD, respectively. Furthermore, the control circuit CNT4-1 is constituted to receive the reset signal /RS4A outputted from each of sense amplifiers A4-1~A4-4.

Output circuits OUT9-1~OUT9-4 are constituted to receive the signal WE inputted through their nodes nWE. Also, output circuits OUT9-1~OUT9-4 are constituted to receive write data WD1, WD2, WD3 and WD4 inputted through their nodes nWD, respectively.

The node n/RS4B of the control circuit CNT4-1 is connected with each node n/RS9C of output circuits OUT9-1 and OUT9-2. The node n/DT4D of the control circuit CNT4-1 is connected with each node n/DT9E of output circuits OUT9-1 and OUT9-2.

Each node n/RS9D of output circuits OUT9-1 and OUT9-2 is connected with the node n/RS4A of the control circuit CNT4-2.

The node n/DT9F of the output circuit OUT9-1 is grounded while the node n/DT9G of the output circuit OUT9-1 is connected with the node n/DT9F of the output circuit OUT9-2. The node n/DT9G of the output circuit OUT9-2 is connected with the node n/DT4C of the control circuit CNT4-2.

The node n/RS4B of the control circuit CNT4-2 is connected with each node n/RS9C of output circuits OUT9-3 and OUT9-4. The node n/DT4D of the control circuit CNT4-2 is connected with each node n/DT9E of output circuits OUT9-3 and OUT9-4.

Each of nodes n/RS9D, n/DT9F and n/DT9G of output circuits OUT9-3 and OUT9-4 is grounded or made opened to the external.

The sense amplifier A4-1 is constituted to supply a read data RD1 to the output circuit OUT9-1. The sense amplifier A4-2 is constituted to supply a read data RD2 to the output circuit OUT9-2. The sense amplifier A4-3 is constituted to supply a read data RD3 to the output circuit OUT9-3. The sense amplifier A4-4 is constituted to supply a read data RD4 to the output circuit OUT9-4.

Output circuits OUT9-1~OUT9-4 are constituted to receive the output control signal OE inputted through their nodes nOE, respectively, and they output the output data DO1~DO4 from their output nodes nDO, respectively, based on the output control signal OE.

In the next, there will be described the structure of output circuit OUT9-1~OUT9-4. As these output circuits have an almost identical structure, the output circuit OUT9-1 will be described as a representative of them with reference to FIG. 22.

Figure 18:
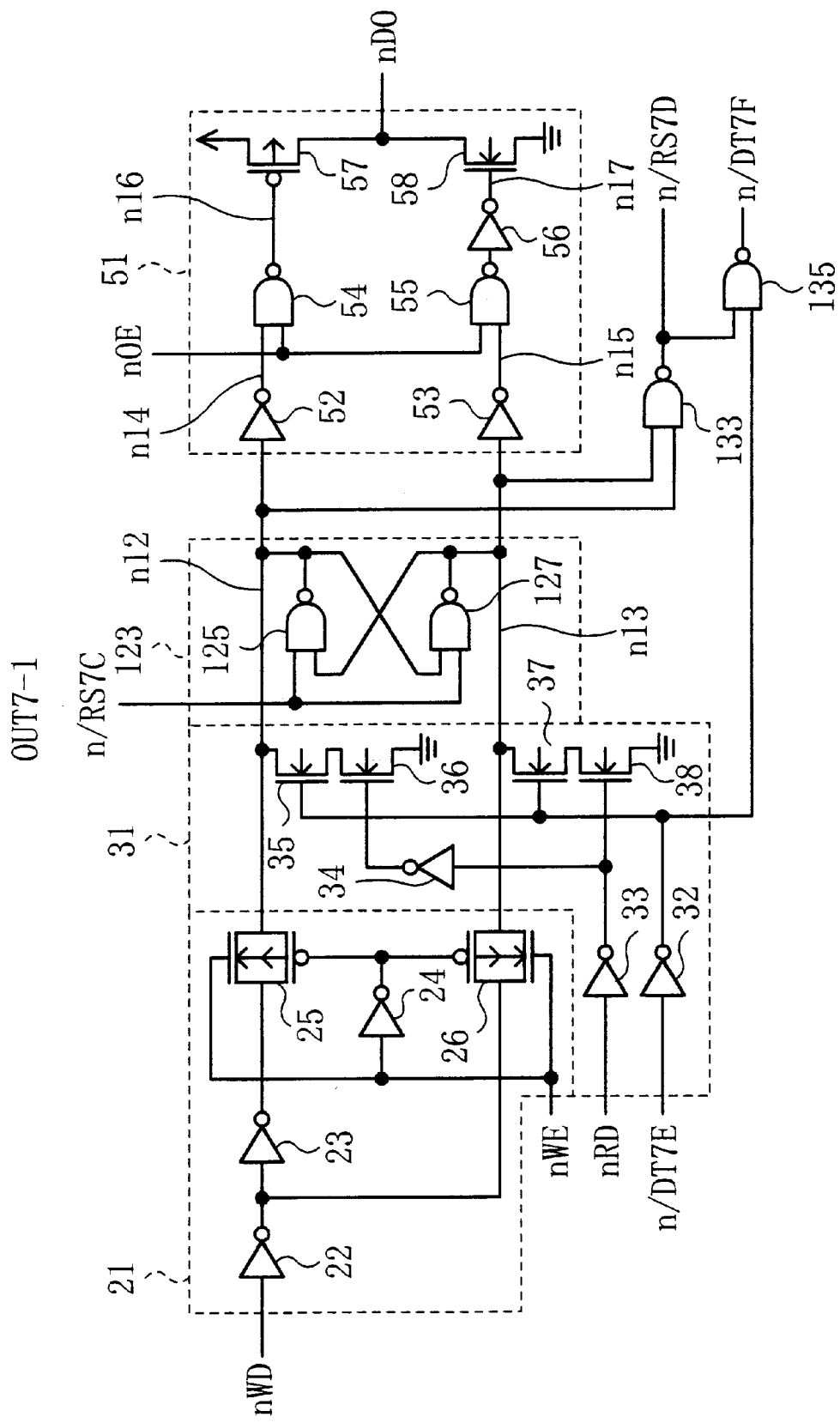
FIG. 18 is a circuit diagram showing the structure of a output circuit prepared in the DRAM shown in FIG. 17.

This output circuit OUT9-1 can be obtained by adding two inverters 153 and 155 and two N-transistors 157 and 159 to the output circuit OUT7-1 as shown in FIG. 18.

The input terminal of the inverter 153 is connected with the output terminal of the NAND gate 133 while the output terminal of the inverter 153 is connected with the gate of the N-transistor 157. The drain of the N-transistor 157 is connected with the node n/RS9D while the source of the same is grounded.

The input terminal of the inverter 155 is connected with the output terminal of the NAND gate 135 while the output terminal of the inverter 155 is connected with the gate of the N-transistor 159. The drain of the N-transistor 159 is connected with the node n/DT9G while the source of the same is connected with the node n/DT9F.

The operation of the DRAM 151 as constituted above according to the ninth embodiment will now be described in the following.

When the sense amplifier A4-1 starts its operation of sense amplification, one of nodes n10 and n11 both of which were at the H-level before the operation starts, is set at the L-level by means of the current mirror circuit 3 and the current mirror circuit 5. In consequence of this level change of the node n10 or n11, the NOR gate 15 outputs the L-level signal, thereby both of P- and N-transistors 95 and 87 being set in the ON state.

When at least one of P-transistors 95 provided in sense amplifiers A4-1~A4-4 goes into the ON state, the reset signal /RS4A inputted to the node n/RS4A of the control circuit CNT4 is set at the L-level. Receiving this L-level reset signal /RS4A, the control circuit CNT4-1 outputs the L-level reset signal /RS9C-12 from its node n/RS4B. At this time, the control circuit CNT4-1 outputs the H-level transition detection signal /DT9E-12 from its node n/DT4D.

When the L-level reset signal /RS9C-12 is inputted to the node n/RS9C of the output circuit OUT9-1 and the node n/RS9C of the output circuit OUT9-2, respective nodes n12 and 13n of output circuits OUT9-1 and OUT9-2 are reset to the H-level, and the node n16 is set at the H-level while the node n17 is set at the L-level by means of the flipflop RS. Therefore, the P- and N-transistors 57 and 58 are turned off, and each output node nDO of output circuits OUT9-1 and OUT9-2 goes into the high impedance state. Also, the N-transistor 157 provided in the output circuit OUT9-1 goes into the ON state, thus the node n/RS9D of the output circuit OUT9-1 being set at the L-level. In the same manner, the N-transistor 157 provided in the output circuit OUT9-2 is set in the ON state, thus the node n/RS9D of the output circuit OUT9-2 being set at the L-level.

The L-level reset signal /RS9D-12 is inputted to the node n/RS4A of the control circuit CNT4-2, and the node n/DT4C of the control circuit CNT4-2 is set at the H-level. With this, the control circuit CNT4-2 supplies the L-level reset signal /RS9C-34 from its node n/RS4B to both of output circuit OUT9-3 and OUT9-4. Receiving this L-level reset signal /RS9C-34, each output node nDO of output circuit OUT9-3 and OUT9-4 goes into in the high impedance state. In this way, each output node nDO of all the output circuits OUT9-1~OUT9-4 is once set in the high impedance state.

At this stage, if each level of read data RD1~RD4 outputted from sense amplifiers A4-1~A4-4 is decided, and also all the N-transistors 87 provided in sense amplifiers A4-1~A4-4 go into the ON state, the transition detection signal /DT4C inputted to the node n/DT4C of the control circuit CNT4-1 is set at the L-level. Subsequently, receiving this L-level transition detection signal /DT4C, the control circuit CNT4-1 outputs the L-level transition detection signal /DT9E-12.

This L-level transition detection signal /DT9E-12 is inputted to each node n/DT9E of output circuits OUT9-1 and OUT9-2, and the output circuit OUT9-1 receives the read data RD1 while the output circuit OUT9-2 receives the read data RD2. Since the node n/DT4D of the control circuit CNT4-1 is set at the L-level, the node n/RS4B of the control circuit CNT4-1 is set at the H-level by the NAND gate 113. The reset signal /RS9C-12 outputted from the node n/RS4B of the control circuit CNT4-1 is set at the H-level, and the RS flip-flop 123 of output circuit OUT9-1 holds the level of both nodes n12 and n13, corresponding to the level of the read data RD1. In the same manner, the RS flip-flop 123 of output circuit OUT9-2 holds the level of both nodes n12 and n13, corresponding to the level of the read data RD2. As a result, each output node nDO of output circuits OUT9-1 and OUT9-2 is released from the high impedance state, thus the output data DO1 and DO2 with a predetermined level being outputted, respectively.

Thus, each node n/RS9D of output circuits OUT9-1 and OUT9-2 is set at the H-level, and the H-level reset signal /RS9D-12 is supplied to the control circuit CNT4-2. Each node n/DT9G of output circuits OUT9-1 and OUT9-2 is set at the L-level, and the node n/DT4C of the control circuit CNT4-2 is set at the L-level.

Receiving the H-level reset signals /RS9D-12, the control circuit CNT4-2 outputs the H-level reset signal /RS9C-34 to each of output circuits OUT9-3 and OUT9-4. Also, the node n/DT4C having been set at the L-level, the control circuit CNT4-2 outputs the L-level transition detection signal /DT9E-34 to each of output circuits OUT9-3 and OUT9-4.

Receiving the H-level reset signal /RS9C-34 and the L-level transition detection signal /DT9E-34, the output circuit OUT9-3 receives the read data RD3 from the sense amplifier A4-3. In the same manner, receiving the H-level reset signal /RS9C-34 and the L-level transition detection signal /DT9E-34, the output circuit OUT9-4 receives the read data RD4 from the sense amplifier A4-4.

As described above, in the DRAM 151 according to the ninth embodiment, the first output circuit group is formed by output circuits OUT9-1 and OUT9-2 while the second output circuit group is formed by output circuits OUT9-3 and OUT9-4.

At first, the output node nDO of all the output circuit OUT9-1 OUT9-4 is set in the high impedance state, and when there have been decided all the outputs of sense amplifiers A4-1~A4-4, output data DO1 and DO2 are outputted from output circuits OUT9-1 and OUT9-2, respectively.

Until there are decided output data DO1 and DO2 of output circuits OUT9-1 and OUT9-2 in the first output circuit group, each output of output circuits OUT9-3 and OUT9-4 in the second output group is set in the high impedance state. After that, when there have been decided output data DO1 and DO2 of output circuits OUT9-1 and OUT9-2 in the first output circuit group, the output node nDO of output circuits OUT9-3 and OUT9-4 in the second output group is released from the high impedance state, thereby output data DO3 and DO4 being outputted.

Therefore, despite that the DRAM 151 according to the ninth embodiment employs such a single data line structure as the DRAM 141 according to the eighth embodiment, it is not required to provide any timing margin for data read. Furthermore, since the current passing through the output circuit OUT9-1~OUT9-4 is reduced, there is effectively prevented generation of the noise that might be caused when outputting the output data DO1~DO4.

Still further, since the DRAM 151 according to the ninth embodiment operates in such a manner that after one of output circuit groups has decided its output, the remaining output circuit groups starts their data output operation shifting their output timing. Therefore, even in case of employing the multi-bit structure (x 16-bit, x 32-bit), it is possible to prevent not only the output delay of the output data but also generation of the noise.

In the DRAM 141 according to the eighth embodiment, if there is increased number of output circuits constituting one output circuit group, it is required to also increase the number of logical gates constituting the control circuit CNT8. Contrary to this, in the DRAM 151 according to the ninth embodiment, even if the number of output circuits constituting one output circuit group is increased, it is not required to change the circuit constitution of the control circuit. This advantageously works when designing a layout of circuits.

In the next, a DRAM 161 as a semiconductor memory, according to the tenth embodiment of the invention will be described with reference to FIGS. 23 and 24 in the following. In the following description, however, it is assumed that the DRAM 161 has a memory structure of n words X 4 bits.

The DRAM 161 according to the tenth embodiment can be constituted by substituting sense amplifiers A1-1~A1-4 of the DRAM 1 for sense amplifiers A10-1~A10-4 according to the first embodiment. Accordingly, FIG. 23 shows only sense amplifiers A10-1~A10-4 without showing the output circuits OUT1-1~OUT1-4.

Figure 23:
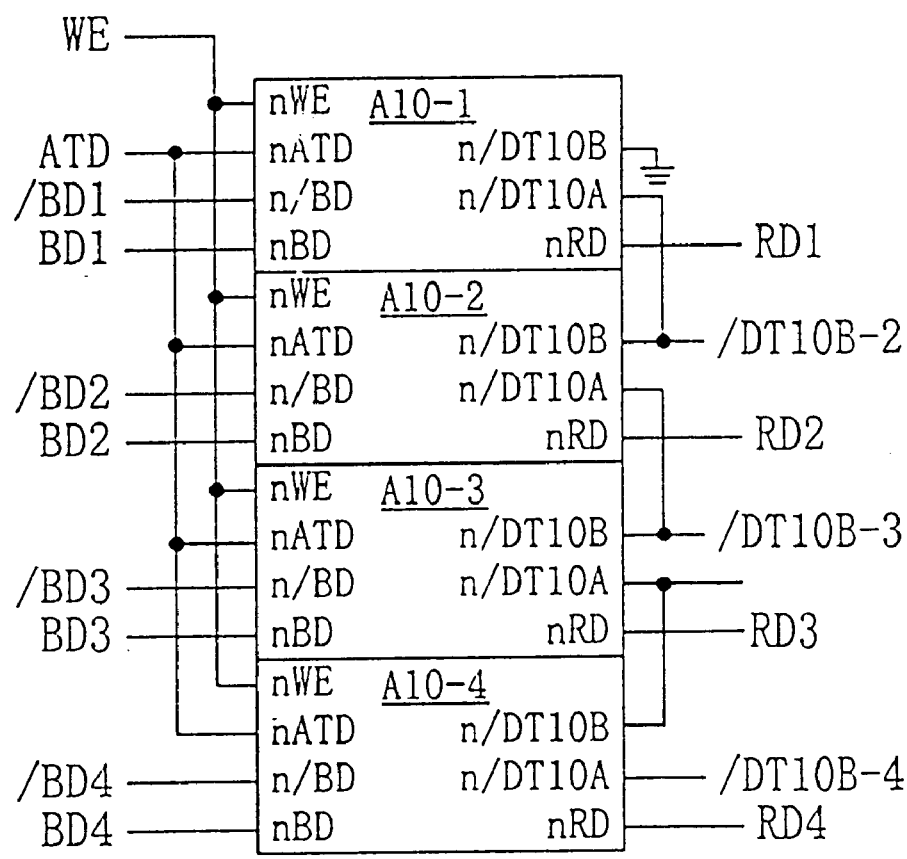
FIG. 23 is a block diagram showing the structure of a DRAM according to the tenth embodiment of the invention.
Figure 24:
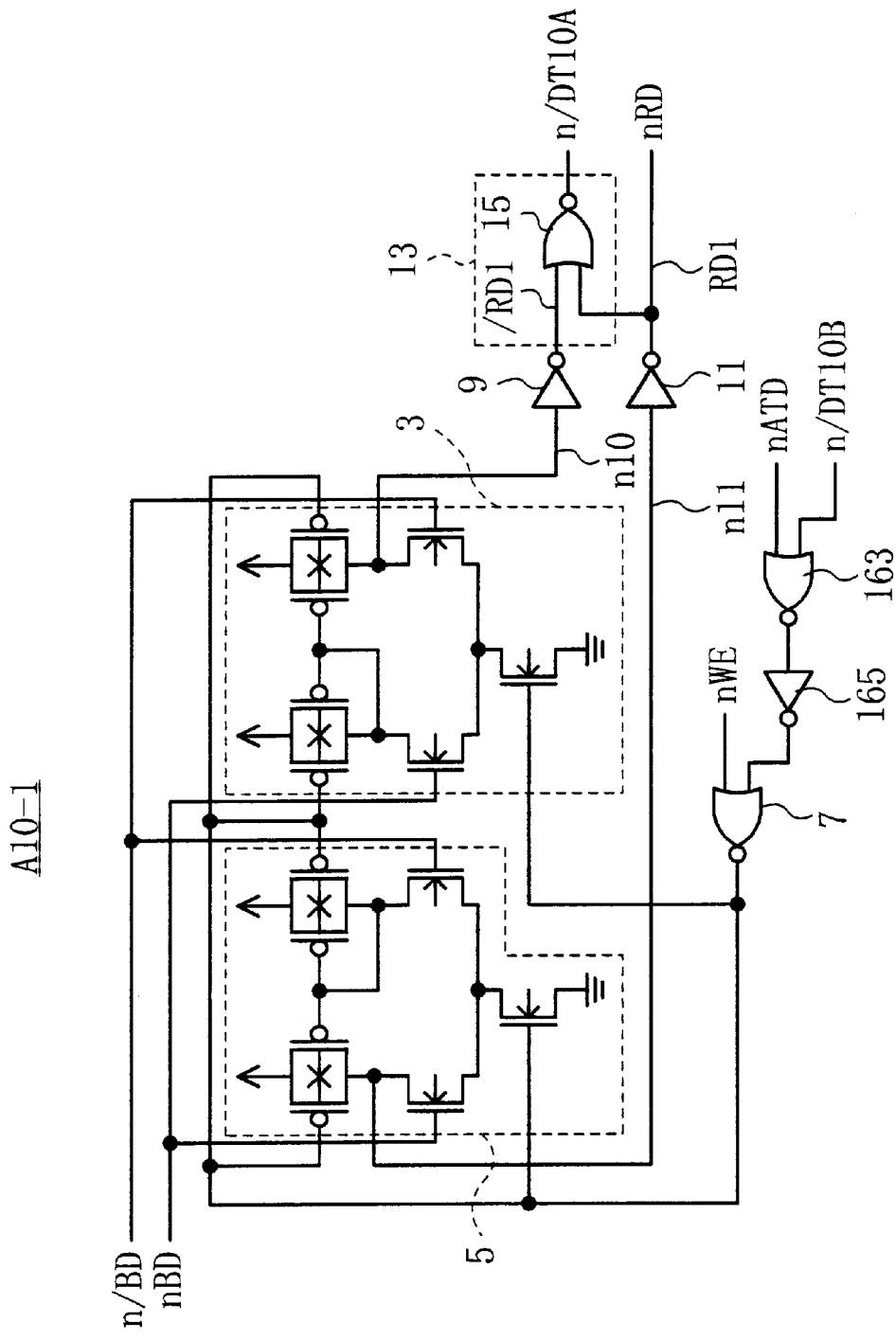
FIG. 24 is a circuit diagram showing the structure of a sense amplifier prepared in the DRAM shown in FIG. 23.

As shown in FIG. 23, sense amplifiers A10-1~A1-4 are constituted to receive the signal WE and the signal ATD inputted through their nodes nWE and nATD, respectively. Sense amplifiers A10-1~A10-4 are constituted to receive complementary memory cell data BD1, /BD1, . . . and BD4, /BD4 inputted through their nodes nBD and n/BD, respectively.

The node n/DT10A of the sense amplifier A10-1 is connected with the node n/DT10B of the sense amplifier A10-2 while the node n/DT10B of the sense amplifier A10-1 is grounded. The node n/DT10A of the sense amplifier A10-2 is connected with the node n/DT10B of the sense amplifier A10-3 while the node n/DT10A of the sense amplifier A10-3 is connected with the node n/DT10B of the sense amplifier A10-4. The node n/DT10A of the sense amplifier A10-4 is made open to the external or grounded.

The sense amplifier A10-1 is constituted to supply a read data RD1 to the output circuit OUT1-1 (not shown). The sense amplifier A10-2 is constituted to supply a read data RD2 to the output circuit OUT1-2 (not shown). The sense amplifier A10-3 is constituted to supply a read data RD3 to the output circuit OUT1-3 (not shown). The sense amplifier A10-4 is constituted to supply a read data RD4 to the output circuit OUT1-4 (not shown).

In the next, there will be described the structure of sense amplifiers A10-1~A10-4. As these sense amplifiers A10-1~A10-4 have an almost identical structure, the sense amplifier A10-1 will be described as a representative of them with reference to FIG. 24.

This sense amplifier A10-1 can be constituted by adding a NOR gate 163 and an inverter 165 to the before-mentioned sense amplifier A1-1.

One input terminal of the NOR gate 163 is connected with the node nATD to which the ATD signal is inputted while the other input terminal of the NOR gate 163 is connected with the node n/DT10B. The output terminal of the NOR gate 163 is connected with the input terminal of the inverter 165. The output terminal of the inverter 165 is connected with one input terminal of a NOR gate 7, of which the other input terminal is connected with the node nWE.

The operation of the DRAM 161 as constituted above according to the tenth embodiment will now be explained in the following.

When any one of the signal WE inputted to the node nWE, the signal ATD inputted to the node nATD and the transition detection signal /DT10B inputted to the node n/DT10B is at the H-level, each of sense amplifier A10-1~A10-4 is set in the reset state. On one hand, when the signal WE, the signal ATD and the transition detection signal /DT10B are set to the L-level, sense amplifier A10-1~A10-4 starts its operation of sense amplification, respectively.

In the reset state and immediately after the operation of sense amplification, nodes n10 and n11 in respective sense amplifiers A10-1~A10-4 are at the H-level, so that the node n/DT10A connected with the output terminal of the NOR gate 15 is set at the H-level. After that, when either node n10 or the node n11 in respective sense amplifiers A10-1~A10-4 is set at the L-level and each level of read data RD1~RD4 outputted from respective sense amplifiers A10-1~A10-4 is decided, the node n/DT10A is set at the L-level.

As shown in FIG. 23, since the node n/DT10B of the sense amplifier A10-1 is grounded, the set/reset of the sense amplifier A10-1 can be controlled by signals WE and ATD.

The set/reset of the sense amplifier A10-2 is controlled by the transition detection signal /DT10A-2 outputted from the node n/DT10B of the sense amplifier A10-1, the signal WE and the signal ATD. This transition detection signal /DT10B-2 is at the H-level when the sense amplifier A10-1 is in the reset state while it is at the L-level when the sense amplifier A10-1 is in the set state. That is, the sense amplifier A10-2 is released from the reset state when there has been decided the level of the read data RD1 outputted from the preceding sense amplifier A10-1, and starts the operation of sense amplification. Such operation as described above can be carried out by sense amplifiers A10-3 and A10-4 in the same manner. That is, the sense amplifier A10-3 is released from the reset state when there has been decided the level of the read data RD2 outputted from the preceding sense amplifier A10-2, and starts the operation of sense amplification. The sense amplifier A10-4 is released from the reset state when there has been decided the level of the read data RD3 outputted from the preceding sense amplifier A10-3, and starts the operation of sense amplification.

As described above, according to the DRAM 161 of the tenth embodiment, one sense amplifier is held in the reset state until the preceding sense amplifier decides the level of the read data outputted therefrom, and starts the operation of sense amplification after the preceding sense amplifier has decided the level of the read data outputted therefrom. Consequently, it can be avoided that a plurality of sense amplifiers A10-1~A10-4 get in the operation of sense amplification at the same time, thus preventing the power source noise and the ground noise from being generated.

In the next, a DRAM 171 as a semiconductor memory, according to the eleventh embodiment of the invention will be described with reference to FIGS. 25 and 26 in the following. In the following description, however, it is assumed that the DRAM 171 has a memory structure of n words X 4 bits.

The DRAM 171 according to the eleventh embodiment can be constituted by adding a control circuit CNT 11 to the DRAM 161 according to the tenth embodiment. Accordingly, FIG. 25 shows only sense amplifiers A10-1~A10-4 and the control circuit CNT 11 without the output circuits OUT1-1~OUT1-4.

Figure 25:
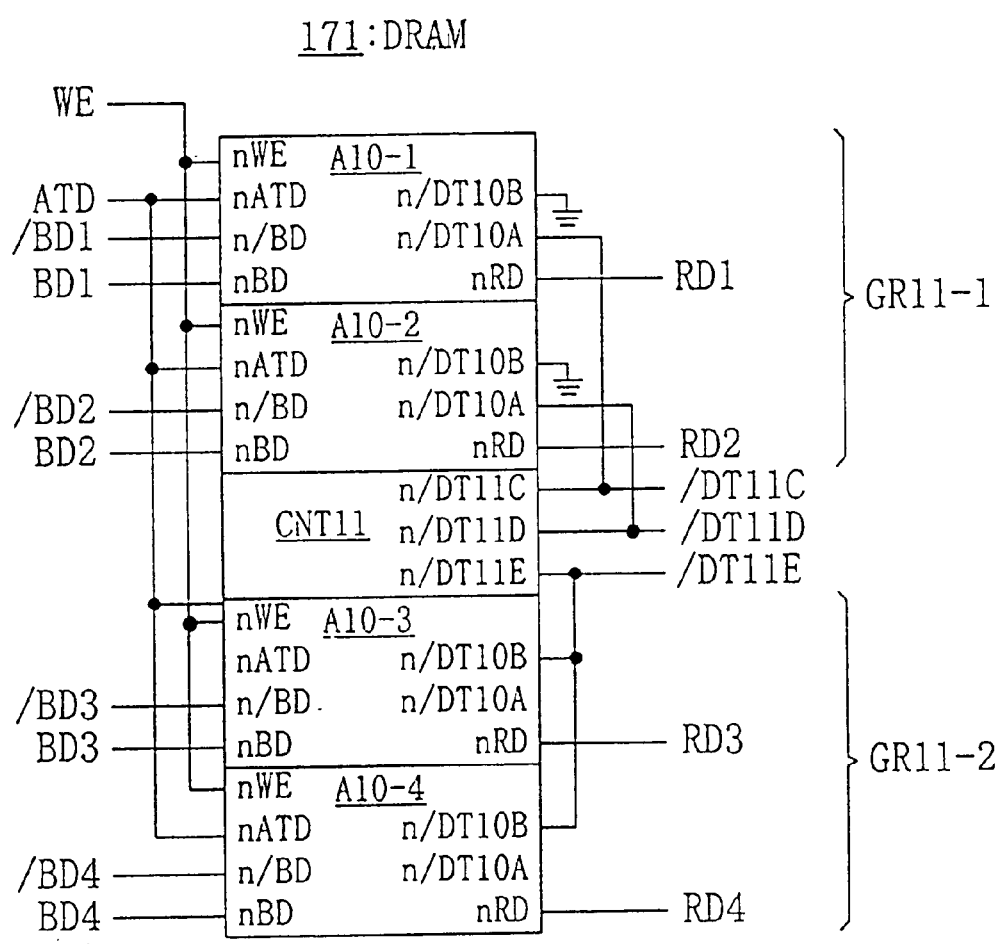
FIG. 25 is a block diagram showing the structure of a DRAM according to the eleventh embodiment of the invention.
Figure 26:
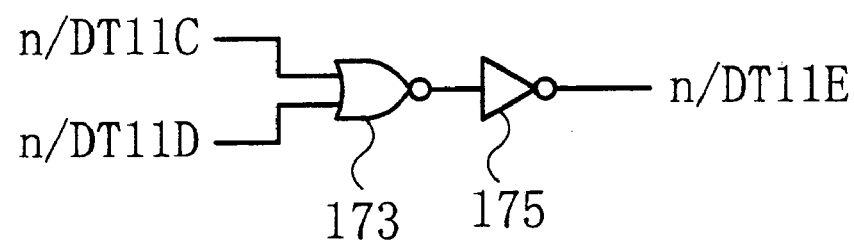
FIG. 26 is a circuit diagram showing the structure of a control circuit prepared in the DRAM shown in FIG. 25.

As shown in FIG. 25, sense amplifiers A10-1~A10-4 are constituted to receive the signal WE and the signal ATD inputted through their nodes nWE and nATD, respectively. Sense amplifiers A10-1~A10-4 are constituted to receive complementary memory cell data BD1, /BD1, . . . and BD4, /BD4 inputted through their nodes nBD and n/BD, respectively.

The node n/DT10A of the sense amplifier A10-1 is connected with the node n/DT11C of the control circuit CNT11 while the node n/DT10B of the sense amplifier A10-1 is grounded. The node n/DT10A of the sense amplifier A10-2 is connected with the node n/DT1 lD of the control circuit CNT11 while the node n/DT10B of the sense amplifier A10-2 is grounded. The node n/DT11E of the control circuit CNT11 is connected with each node DT10B of sense amplifiers A10-3 and A10-4. Each node n/DT10A of sense amplifiers A10-3 and A10-4 is made open to the external or grounded.

The sense amplifier A10-1 is constituted to supply a read data RD1 to the output circuit OUT1-1 (not shown). The sense amplifier A10-2 is constituted to supply a read data RD2 to the output circuit OUT1-2 (not shown). The sense amplifier A10-3 is constituted to supply a read data RD3 to the output circuit OUT1-3 (not shown). The sense amplifier A10-4 is constituted to supply a read data RD4 to the output circuit OUT1-4 (not shown).

In the next, there will be described the structure of the control circuit CNT1 with reference to FIG. 26. This control circuit CNT11 includes a NOR gate 173 and an inverter 175. One input terminal of the NOR gate 173 is connected with the node n/DT11C while the other input terminal of the NOR gate 173 is connected with the node n/DT11D. The output terminal of the NOR gate 173 is connected with the input terminal of the inverter 175. The output terminal of the inverter 175 is connected with node n/DT11E. The first sense amplifier group GR11-1 is formed by sense amplifiers A10-1 and A10-2 while the second sense amplifier group GR11-2 is formed by sense amplifiers A10-3 and A10-4.

The operation of the DRAM 171 as constituted above according to the eleventh embodiment will now be explained in the following.

Since each node n/DT10B of sense amplifiers A10-1 and A10-2 belonging to the first sense amplifier group GR11-1 is grounded, the set/reset of respective sense amplifiers A10-1 and A10-2 are controlled by the signal WE and the signal ATD.

In the reset state and immediately after the operation of sense amplification, nodes n10 and n11 in respective sense amplifiers A10-1 and A10-2 are at the H-level, so that the node n/DT10A connected with the output terminal of the NOR gate 15 is set at the H-level.

After that, when either node n10 or node n11 in the sense amplifier A10-1 is set at the L-level and there has been decided the level of the read data RD1 outputted from the sense amplifier A10-1, the L-level transition detection signal /DT11C is outputted from the node n/DT10A of the sense amplifier A10-1.

Also, when either node n10 or node n11 in sense amplifier A10-2 is set at the L-level and there has been decided the level of the read data RD2 outputted from the sense amplifier A10-2, the L-level transition detection signal /DT11D is outputted from the node n/DT10A of the sense amplifier A10-2.

Receiving the L-level transition detection signal /DT11C and the L-level transition detection signal /DT11D, the control circuit CNT11 outputs the L-level transition detection signal /DT11E from its node n/DT11E.

The set/reset of sense amplifiers A10-3 and A10-4 belonging the second sense amplifier group GR11-2 are controlled by the transition detection signal /DT11E when the signal WE and the signal ATD are at the L-level. As described above, when there has been decided each level of read data RD1 and RD2 from sense amplifiers A10-1 and A10-2 belonging to the first sense amplifier group GR11-1, the control circuit CNT11 outputs the L-level transition detection signal /DT11E to each node DT10B of sense amplifiers A10-3 and A10-4 belonging to the second sense amplifier group GR11-2. That is, sense amplifiers A10-3 and A10-4 belonging to the second sense amplifier group GR11-2 are released from the reset state and start the operation of sense amplification when there has been decided each level of the read data RD1 and RD2 from sense amplifiers A10-1 and A10-2 belonging to the first sense amplifier group GR11-1.

As described above, according to the DRAM 171 of the eleventh embodiment, sense amplifiers A10-3 and A10-4 belonging to the second sense amplifier group GR11-2 are set in the reset state until sense amplifiers A10-1 and A10-2 belonging to the first sense amplifier group GR11-1 decide the level of the read data outputted therefrom, and starts the operation of sense amplification after sense amplifiers A10-1 and A10-2 belonging to the first sense amplifier group GR11-1 have decided the level of the read data outputted therefrom. Consequently, a plurality of sense amplifiers A10-1~A10-4 can prevent generation of the power source noise and the ground noise when they start their operation of sense amplification.

Furthermore, according to the DRAM 171 of the eleventh embodiment, since a plurality of sense amplifiers belonging to one sense amplifier group can start their operation of sense amplification at the same time, so that the high speed operation of sense amplification can be carried out even when employing the multi-bit structure (x 16-bit, x 32-bit).

In the next, a DRAM 181 as a semiconductor memory, according to the twelfth embodiment of the invention will be described with reference to FIGS. 27 and 28 in the following. In the following description, however, it is assumed that the DRAM 181 has a memory structure of n words X 4 bits.

The DRAM 181 according to the twelfth embodiment can be constituted by substituting sense amplifiers A12-1~A12-4 for sense amplifiers A10-1~A10-4 of the DRAM 161 according to the tenth embodiment and also adding the above-mentioned control circuit CNT2 used in the DRAM 161. Accordingly, FIG. 27 shows only sense amplifiers A12-1~A12-4 and the control circuit CNT2 without showing the output circuits OUT1-1~OUT1-4.

Figure 27:
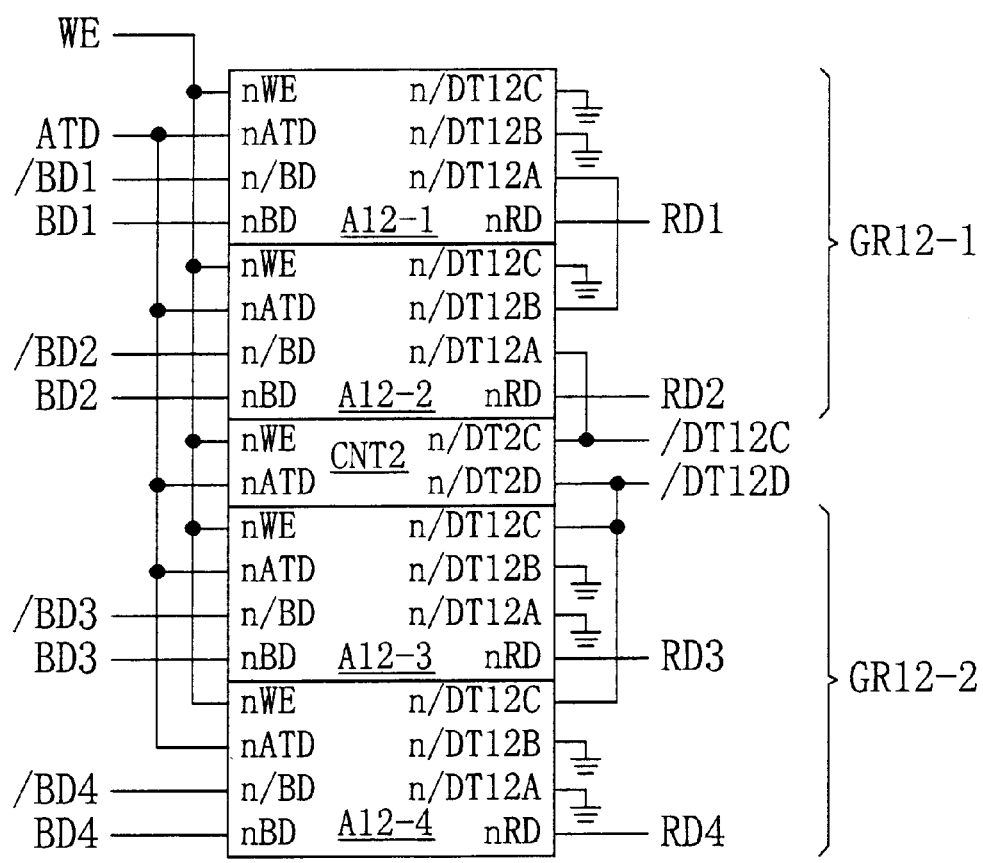
FIG. 27 is a block diagram showing the structure of a DRAM according to the twelfth embodiment of the invention.
Figure 28:
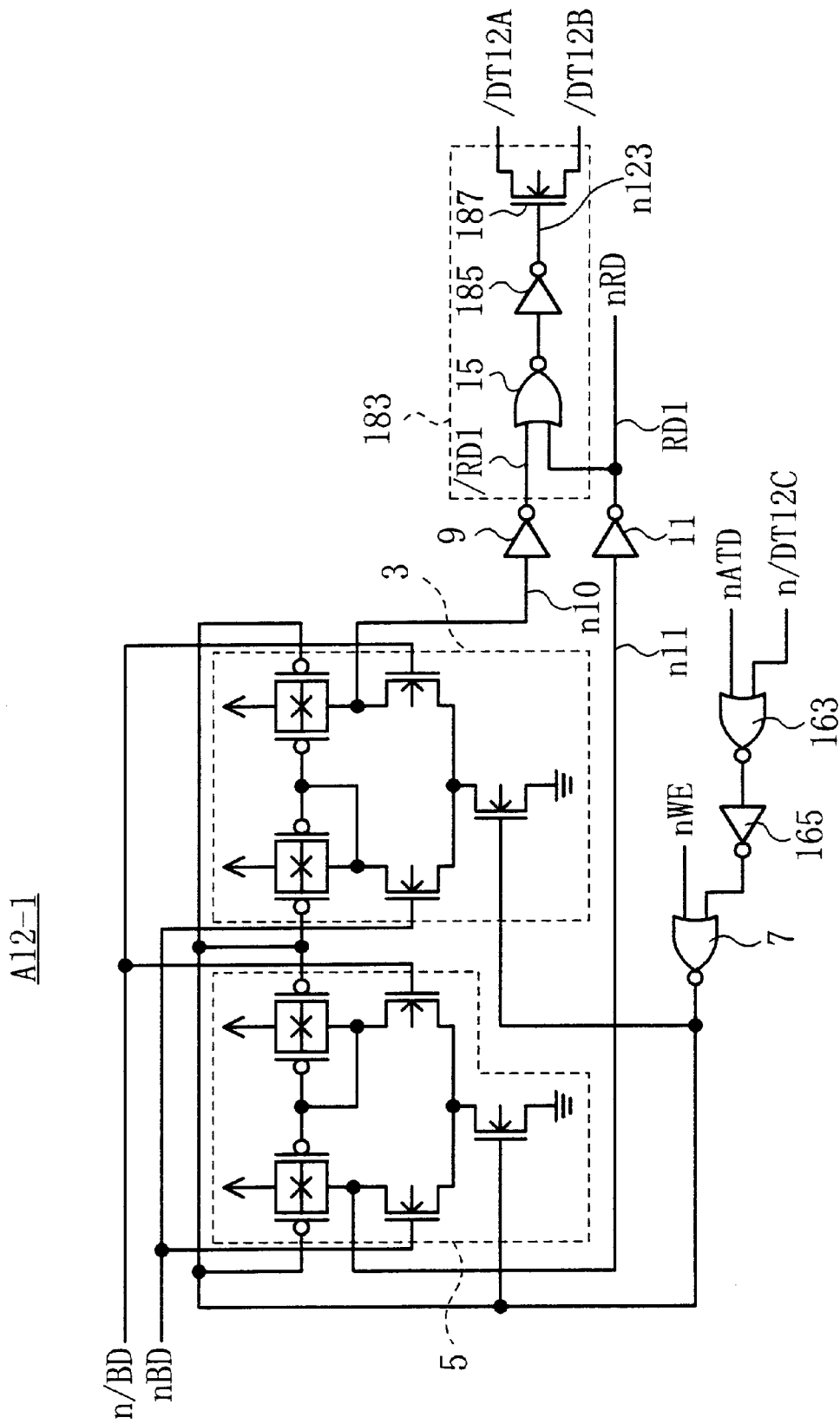
FIG. 28 is a circuit diagram showing the structure of a sense amplifier prepared in the DRAM shown in FIG. 27.

As shown in FIG. 27, sense amplifiers A12-1~A12-4 are constituted to receive the signal WE and the signal ATD inputted through their nodes nWE and nATD, respectively. Sense amplifiers A12-1~A12-4 are constituted to receive complementary memory cell data BD1, /BD1, . . . and BD4, /BD4 inputted through their nodes nBD and n/BD, respectively.

The control circuit CNT2 is constituted to receive the signal WE inputted through its node nWE and also to receive the signal ATD inputted through its node nATD.

The node n/DT12A of the sense amplifier A12-1 is connected with the node n/DT12B of the sense amplifier A12-2 while nodes n/DT12B and n/DT12C of the sense amplifier A12-1 are grounded. The node n/DT12A of the sense amplifier A12-2 is connected with the node n/DT2C of the control circuit CNT2 while the node n/DT12C of the sense amplifier A12-2 is grounded. The node n/DT2D of the control circuit CNT2 is connected with each node n/DT12C of sense amplifiers A12-3 and A12-4. Nodes n/DT12A and n/DT12B of sense amplifiers A12-3 and A12-4 are made open to the external or grounded.

The sense amplifier A12-1 is constituted to supply a read data RD1 to the output circuit OUT1-1 (not shown). The sense amplifier A12-2 is constituted to supply a read data RD2 to the output circuit OUT1-2 (not shown). The sense amplifier A12-3 is constituted to supply a read data RD3 to the output circuit OUT1-3 (not shown). The sense amplifier A12-4 is constituted to supply a read data RD4 to the output circuit OUT1-4 (not shown).

In the next, there will be described the structure of the sense amplifiers A12-1~A12-4. Since these sense amplifiers A12-1~A12-4 have an almost identical structure, the sense amplifier A12-1 will be described as a representative of them with reference to FIG. 28.

This sense amplifier A12-1 can be constituted by substituting a read data transition detection circuit 183 for the read data transition detection circuit 13 of the sense amplifier A10-1 as described in connection with the tenth embodiment.

This read data transition detection circuit 183 includes a NOR gate 15, an inverter 185 and an N-transistor 187.

The output terminal of the NOR gate 15 is connected with the input terminal of the inverter 185 while the gate of the N-transistor 187 is connected with the output terminal of the inverter 185. The drain of the N-transistor 187 is connected with the node n/DT12A while the source of the same is connected with the node n/DT12B.

Sense amplifiers A12-1 and A12-2 form the first sense amplifier group GR12-1 while sense amplifiers A12-3 and A12-4 form the second sense amplifier group GR12-2.

The operation of the DRAM 181 as constituted above according to the twelfth embodiment will be described in the following.

When the signal WE inputted to the node nWE, the signal ATD inputted to the node nATD, or the transition detection signal /DT12C inputted to the node n/DT12C is set at the H-level, sense amplifiers A12-1~A12-4 are set in the reset state. On one hand, when the signal WE, the signal ATD and the transition detection signal /DT12C are set at the L-level, sense amplifiers A12-1~A12-4 start their operation of sense amplification.

In the reset state and immediately after the operation of sense amplification, nodes n10 and n11 in respective sense amplifiers A12-1~A12-4 are at the H-level, so that the node n123 connected with the output terminal of the inverter 185 is set at the L-level and the N-transistor 187 is set in the OFF state.

After that, if either node n10 or node n11 in respective sense amplifiers A12-1~A12-4 is set at the L-level and there has been decided each level of read data RD1~RD4 outputted from respective sense amplifiers A12-1~A12-4, the node n123 is set at the H-level and the N-transistor 187 is set in the ON state.

When either signal WE inputted to the node nWE or signal ATD inputted to node nATD is set at the H-level, the control circuit CNT2 is reset and outputs the H-level transition detection signal /DT12D from its node n/DT12D.

When there have been decided read data RD1 and RD2 from sense amplifiers A12-1 and A12-2 belonging to the first sense amplifier group GR12-1, the L-level transition detection signal /DT12C is inputted to the node n/DT12C of the control circuit CNT2. Then, receiving this L-level transition detection signal /DT12C, the control circuit CNT2 outputs the L-level transition detection signal /DT12D from its node n/DT12D.

This L-level transition detection signal /DT12D is inputted to each node n/DT12C of sense amplifiers A12-3 and A12-4 belonging to the second sense amplifier group GR12-2. That is, when read data RD1 and RD2 from sense amplifiers A12-1 and A12-2 belonging to the first sense amplifier group GR12-1 have been decided, sense amplifiers A12-3 and A12-4 belonging to the second sense amplifier group GR12-2 are released from the reset state and start the operation of sense amplification thereof.

As described above, according to the DRAM 181 of the twelfth embodiment, sense amplifiers A12-3 and A12-4 belonging to the second sense amplifier group GR12-2 are set in the reset state until sense amplifiers A12-1 and A12-2 belonging to the first sense amplifier group GR12-1 have decided the level of the read data outputted therefrom, and start the operation of sense amplification after sense amplifiers A12-1 and A12-2 belonging to the first sense amplifier group GR12-1 have decided the level of the read data outputted therefrom. Consequently, a plurality of sense amplifiers A12-1~A12-4 can prevent generation of the power source noise and the ground noise when they start their operation of sense amplification.

Furthermore, according to the DRAM 181 of the twelfth embodiment, a plurality of sense amplifiers belonging to one sense amplifier group can start their operation of sense amplification at the same time, so that the high speed operation of sense amplification can be carried out even when employing the multi-bit structure (x 16-bit, x 32-bit).

Still further, according to the DRAM 181 of the twelfth embodiment, even if the number of sense amplifiers constituting one sense amplifier group is increase, the number of input signals to the control circuit CNT2 can be kept unchanged. Therefore, it is not required to change the circuit constitution of the control circuit CNT2. Thus, the constitution of the sense amplifier group can be changed so as to meet the specification of the DRAM 181 without enlarging the circuit scale.

The invention has been discussed in connection with some preferred embodiments so far. Needless to say, however, the invention should not be limited to those examples preferably embodying the invention. It is apparent that any one skill in the art can variously change and modify the invention within the range of the technical thoughts recited in the claims appended hereto, and it is understood that such changes and modifications should belong to the technical scope of the invention.

For instance, in the above embodiments, the invention has been only applied to the DRAM. However, the invention should not be limited to such application only to the DRAM. The invention is widely applicable to other semiconductor devices such as memories, registers and so forth.

Furthermore, in the embodiments as mentioned above, the signal WE has been described as a control signal for controlling the data read. However, the signal WE may be replaced by other control signals such as a chip control signal, a byte control signal or a signal resulting from the logical operation thereof.

As discussed above, according to the invention, it becomes possible to input the read data from the sense amplifier to the output circuit at the high speed, minimizing the circuit scale. Furthermore, according to the other aspect of the invention, it also becomes possible to reduce the power consumption and to prevent the noise from being generated. Still further, according to the other aspect of the invention, it becomes possible to prevent or minimize the output delay of the output data outputted from the output circuit.

The entire disclosure of Japanese Patent Application No. 11-38467 filed on Feb. 17, 1999 including specification, claims, drawings and summary is incorporated herein by reference in its entirety.

What is claimed is:

1. A semiconductor memory comprising:

n sense amplifiers that amplify stored data and output the amplified data as read data, wherein n is an integer greater than one;

n output circuits that provide output data based on the read data output from said sense amplifiers; and a read data transition detection circuit which detects that there has been decided a level transition of each of the read data to be output to each of said output circuits and that outputs a read data transition detection signals, said output circuits each receive the read data output from respective ones of said sense amplifiers in response to the read data transition detection signal.

2. The semiconductor memory as claimed in claim 1, wherein said control circuit outputs a reset signal until all of said sense amplifiers output the read data transition detection signals, after any one of said sense amplifiers has first decided the level transition of a read data and has output a read data transition detection signal.

3. The semiconductor memory as claimed in claim 2, wherein each of said output circuits sets an output node for outputting the output data in a high impedance state in response to the reset signal.

4. The semiconductor memory as claimed in claim 2, wherein a first of said output circuits sets a first output node of said first output circuit for outputting the output data in a high impedance state in response to the reset signal and receives the read data output from a corresponding sense amplifier in response to all the read data transition detection signals, a second of said output circuits sets a second output node of said second output circuit in a high impedance state based on the first output node being set in the high impedance state and receives the read data output from a corresponding sense amplifier based on that the level transition of the output data output from said first output circuit has been decided, and a kth output circuit of said output circuits sets a kth output node of said kth output circuit in a high impedance state based on a k−1th output node of a k−1th output circuit being set in the high impedance state and receives the read data output from a corresponding sense amplifier based on that the level transition of the output data output from k−1th output circuit has been decided, wherein k is an integer from three through n.

5. The semiconductor memory as claimed in claim 2, wherein said output circuits are divided into m output circuit groups, wherein m is an integer greater than one, said control circuit being assigned to a first output circuit group and an ith control circuit being assigned to an ith output circuit group, wherein i is an integer from two through m, said control circuit supplies all the read data transition detection signals and the reset signal to one or more than to of the output circuits of said first output circuit group, and said ith control circuit set output nodes in one or more than two of the output circuits in a high impedance state based on an output node of at least one output circuit of one or more than two of the output circuits belonging to an i−1th output circuit group being set in a high impedance state, detects all the level transitions of the output data output from one or more than two of the output circuits belonging to said i−1th output circuit group, and further allows one or more than two of the output circuits belonging to an ith output circuit group to receive the read data output from a corresponding sense amplifier.

6. The semiconductor memory as claimed in claim 5, wherein said i−1th output circuit group supplies said ith control circuit with signals comprising an i−1th output node status signal indicating that at least one output node of respective nodes in one or more than two of the output circuits belonging to said i−1th output circuit group is set in a high impedance state, and an i−1th output data transition detection signal indicating that there has been decided all the level transitions of the output data output from each output node in one or more than two of the output circuits belonging to said i−1th output circuit group.

7. The semiconductor memory as claimed in claim 2, wherein each of said output circuits includes a read data holding portion for holding the read data supplied from each of said sense amplifiers, said read data holding portion resetting the read data as held thereby.

8. The semiconductor memory as claimed in claim 7, wherein said read data holding portion includes a latch circuit consisting of two inverters.

9. The semiconductor memory as claimed in claim 7, wherein said read data holding portion includes an RS flip-flop circuit.

10. The semiconductor memory as claimed in claim 1, wherein an h+1th sense amplifier of said sense amplifiers starts an operation of data amplification when there has been decided the level transition of the read data output from an hth sense amplifier, wherein h is an integer from one through n.

11. The semiconductor memory as claimed in claim 1, wherein said sense amplifiers are divided into j sense amplifier groups, wherein j is and integer of two or more, the semiconductor memory further comprising:

a gth control circuit assigned to a gth sense amplifier group, wherein g is an integer from two through J said gth control circuit detects all the level transitions of the output data output from one or more than two of said sense amplifiers belonging to a g−1th sense amplifier group, and further allows one or more than two of said sense amplifiers belonging to the gth sense amplifier group to start operation of data amplification.

12. The semiconductor memory as claimed in claim 11, wherein said g−1th sense amplifier group supplies said gth control circuit with a g−1th read data transition detection signal indicating that there have been decided all the level transitions of the read data output from one or more than two of said sense amplifiers belonging to said g−1th sense amplifier group.

13. A semiconductor memory comprising:

n sense amplifiers that amplify stored data and output the amplified data as read data, wherein n is an integer greater than one;

n output circuits that provide output data based on the read data output from each of said sense amplifiers, said sense amplifiers each including a read data transition detection circuit that detects that there has been decided a level transition of the read data to be output from a corresponding sense amplifier to a respective one of said output circuits and that outputs a read data transition detection signal; and a control circuit that provides the read data transition detection signals to said output circuits when the level transitions of the read data have been decided.

\* \* \* \* \*